(12) United States Patent
Wang et al.

(10) Patent No.: US 12,089,474 B2
(45) Date of Patent: Sep. 10, 2024

(54) TEXTURE RECOGNITION APPARATUS AND OPPOSITE SUBSTRATE

(71) Applicant: BOE Technology Group Co., Ltd., Beijing (CN)

(72) Inventors: Lei Wang, Beijing (CN); Xiaoliang Ding, Beijing (CN); Yingming Liu, Beijing (CN); Lei Zhang, Beijing (CN); Peng Jia, Beijing (CN); Shi Shu, Beijing (CN); Yunke Qin, Beijing (CN); Lin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 269 days.

(21) Appl. No.: 17/425,898

(22) PCT Filed: Apr. 27, 2020

(86) PCT No.: PCT/CN2020/087170
§ 371 (c)(1),
(2) Date: Jul. 26, 2021

(87) PCT Pub. No.: WO2021/217325
PCT Pub. Date: Nov. 4, 2021

(65) Prior Publication Data
US 2022/0358782 A1 Nov. 10, 2022

(51) Int. Cl.
*G06V 40/13* (2022.01)
*G06F 3/041* (2006.01)
(Continued)

(52) U.S. Cl.
CPC .......... *H10K 59/60* (2023.02); *G06F 3/0412* (2013.01); *G06F 3/0443* (2019.05);
(Continued)

(58) Field of Classification Search
CPC .......... G06F 3/042–0428; G06F 3/041; G06V 40/1318
See application file for complete search history.

(56) References Cited

U.S. PATENT DOCUMENTS 8,710,442 B2 4/2014 Kanda et al.
8,823,858 B2 9/2014 Ono
(Continued)

FOREIGN PATENT DOCUMENTS

CN 102727212 A 10/2012
CN 107958240 A 4/2018
(Continued)

OTHER PUBLICATIONS

Jan. 3, 2023—(US) Office Action U.S. Appl. No. 17/264,143.
(Continued)

*Primary Examiner* — Roberto W Flores
(74) *Attorney, Agent, or Firm* — Banner & Witcoff, Ltd.

(57) ABSTRACT

A texture recognition apparatus and an opposite substrate are provided. The texture recognition apparatus includes a light source array, an image sensor array and a light shielding layer. The light source array includes a plurality of light sources; the image sensor array includes a plurality of image sensors, an orthographic projection of the light shielding layer on a plane where the light source array is located is between two adjacent light sources, an orthographic projection of the light shielding layer on a plane where the image sensor array is located at least partially overlaps with the plurality of image sensors; the light shielding layer has at least one opening, and at least a part of an orthographic projection of the first opening on the plane where the image sensor array is located is at least on one side of the first image sensor or overlaps with the first image sensor.

16 Claims, 12 Drawing Sheets

(51) Int. Cl.
  *G06F 3/044* (2006.01)
  *H10K 50/86* (2023.01)
  *H10K 59/126* (2023.01)
  *H10K 59/60* (2023.01)
  *H10K 59/35* (2023.01)
  *H10K 59/65* (2023.01)

(52) U.S. Cl.
  CPC ........ *G06F 3/0446* (2019.05); *G06V 40/1318* (2022.01); *H10K 50/865* (2023.02); *H10K 59/126* (2023.02); *G06F 2203/04107* (2013.01); *H10K 59/35* (2023.02); *H10K 59/65* (2023.02)

(56) References Cited

U.S. PATENT DOCUMENTS

| | | | |
|---|---|---|---|
| 9,542,022 | B2 | 1/2017 | Kozuma |
| 10,460,147 | B2* | 10/2019 | Yang ............ G06F 3/0412 |
| 10,719,684 | B2 | 7/2020 | Cao et al. |
| 10,763,315 | B2 | 9/2020 | Bang et al. |
| 10,803,285 | B2 | 10/2020 | Zhao et al. |
| 10,936,845 | B2 | 3/2021 | Zhou |
| 11,036,959 | B2 | 6/2021 | Lin et al. |
| 11,087,112 | B2 | 8/2021 | He et al. |
| 2007/0253607 | A1 | 11/2007 | Higuchi |
| 2012/0200506 | A1* | 8/2012 | Taylor ............ H05K 1/18 439/55 |
| 2012/0256089 | A1 | 10/2012 | Kanda et al. |
| 2013/0120760 | A1 | 5/2013 | Raguin et al. |
| 2014/0299879 | A1 | 10/2014 | Yamazaki |
| 2018/0019288 | A1 | 1/2018 | Yang et al. |
| 2018/0196985 | A1 | 7/2018 | Ling et al. |
| 2018/0233531 | A1* | 8/2018 | Huang ............ H01L 27/14625 |
| 2019/0172887 | A1 | 6/2019 | Sun et al. |
| 2019/0237521 | A1 | 8/2019 | Ju |
| 2020/0105841 | A1 | 4/2020 | Bang et al. |
| 2020/0242319 | A1 | 7/2020 | Zeng et al. |
| 2020/0343477 | A1 | 10/2020 | Zeng et al. |
| 2020/0349334 | A1 | 11/2020 | Li et al. |
| 2020/0379602 | A1 | 12/2020 | Zeng et al. |
| 2021/0004556 | A1* | 1/2021 | Reinhold ............ G06V 40/1359 |
| 2021/0036035 | A1 | 2/2021 | Chang et al. |
| 2021/0043692 | A1* | 2/2021 | Cha .................... H10K 59/126 |
| 2021/0056905 | A1 | 2/2021 | Liu et al. |
| 2021/0134866 | A1 | 5/2021 | Chen et al. |
| 2021/0134896 | A1 | 5/2021 | Guo et al. |
| 2021/0233975 | A1* | 7/2021 | Bouthinon ............ H10K 59/38 |
| 2021/0334498 | A1 | 10/2021 | Niu et al. |
| 2021/0375999 | A1 | 12/2021 | Xu et al. |
| 2021/0408088 | A1 | 12/2021 | Ban et al. |
| 2022/0039697 | A1 | 2/2022 | Higano et al. |

FOREIGN PATENT DOCUMENTS

| | | |
|---|---|---|
| CN | 108054191 A | 5/2018 |
| CN | 108288681 A | 7/2018 |
| CN | 108598111 A | 9/2018 |
| CN | 108615746 A | 10/2018 |
| CN | 109215604 A | 1/2019 |
| CN | 109685003 A | 4/2019 |
| CN | 109784303 A | 5/2019 |
| CN | 109801946 A | 5/2019 |
| CN | 109858398 A | 6/2019 |
| CN | 110061042 A | 7/2019 |
| CN | 110068947 A | 7/2019 |
| CN | 110188702 A | 8/2019 |
| CN | 110444158 A | 11/2019 |
| CN | 110456547 A | 11/2019 |
| CN | 110678983 A | 1/2020 |
| CN | 110970475 A | 4/2020 |
| JP | 01158769 A | 6/1989 |
| JP | 2007299085 A | 11/2007 |
| JP | 2011070658 A | 4/2011 |
| JP | 2012221083 A | 11/2012 |
| JP | 2020184227 A | 11/2020 |
| WO | 2013027488 A1 | 2/2013 |

OTHER PUBLICATIONS

May 25, 2023—(EP) Extended European Search Report Appn 20920750.5.
Mar. 16, 2022—(US) Non-Final Office Action U.S. Appl. No. 17/264,143.
Sep. 21, 2023—(EP)—Extended European Search Report Appn 20900723.6.
Dec. 11, 2023—(JP) Office Action Application No. 2021-568952.
Mar. 19, 2024—(JP) Office Action Application No. 2021-564686, pp. 1-7.
Mar. 19, 2024—(JP) Office Action Application No. 2021-564686, pp. 1-7, English Translation.
May 20, 2024—(JP) Office Action Application No. 2021-568952, pp. 1-4.
May 20, 2024—(JP) Office Action Application No. 2021-568952, pp. 1-4, English translation.

* cited by examiner

TEXTURE RECOGNITION APPARATUS AND OPPOSITE SUBSTRATE

The application is a U.S. National Phase Entry of International Application No. PCT/CN2020/087170 filed on Apr. 27, 2020, designating the United States of America. The present application claims priority to and the benefit of the above-identified applications and the above-identified applications are incorporated by reference herein in their entirety.

TECHNICAL FIELD

Embodiments of the present disclosure relate to a texture recognition apparatus and an opposite substrate.

BACKGROUND

With increasing popularity of mobile terminals, more and more users use mobile terminals to perform operations such as identity verification, electronic payment and so on. Because of the uniqueness of skin textures such as fingerprint patterns or palm print patterns, fingerprint recognition technology combined with optical imaging is gradually adopted by mobile electronic devices for identity verification, electronic payment, etc. How to design a more optimized texture recognition apparatus is a focus problem in the art.

SUMMARY

At least one embodiment of the present disclosure provides a texture recognition apparatus, which comprises a light source array, an image sensor array and a light shielding layer. The light source array comprises a plurality of light sources; the image sensor array comprises a plurality of image sensors, the plurality of image sensors are configured to receive light that is emitted from the plurality of light sources and reflected to the plurality of image sensors by a texture for texture image collection, and the plurality of image sensors comprise a first image sensor; and the light shielding layer is on a light incident side of the image sensor array, an orthographic projection of the light shielding layer on a plane where the light source array is located is between two adjacent light sources of the plurality of light sources, and an orthographic projection of the light shielding layer on a plane where the image sensor array is located at least partially overlaps with the plurality of image sensors, the light shielding layer has at least one opening, and the at least one opening is configured to allow the light that is emitted from the plurality of light sources and reflected to the plurality of image sensors by the texture to pass through; the at least one opening comprises a first opening, and at least a part of an orthographic projection of the first opening on the plane where the image sensor array is located is on at least one side of the first image sensor or overlaps with the first image sensor.

For example, in the texture recognition apparatus provided by at least one embodiment of the present disclosure, the at least one opening comprises a plurality of first openings, and the plurality of first openings are in one-to-one correspondence with the plurality of image sensors, for one first opening and one image sensor that are in correspondence with each other, at least a part of an orthographic projection of the one first opening on the plane where the image sensor array is located is on at least one side of the one image sensor or overlaps with the one image sensor.

For example, in the texture recognition apparatus provided by at least one embodiment of the present disclosure, for one first opening and one image sensor that are in correspondence with each other, an overlapping area of an orthographic projection of the one first opening on the plane where the image sensor array is located and the one image sensor is less than 50% of an area occupied by the one image sensor on the plane where the image sensor array is located.

For example, in the texture recognition apparatus provided by at least one embodiment of the present disclosure, the texture recognition apparatus comprises a display panel, the display panel comprises an array substrate, the array substrate comprises a base substrate and a sub-pixel array on the base substrate, and the sub-pixel array comprises a plurality of sub-pixels, the light source array comprises the sub-pixel array, and the plurality of light sources comprise the plurality of sub-pixels.

For example, in the texture recognition apparatus provided by at least one embodiment of the present disclosure, each of the plurality of sub-pixels comprises a light-emitting device, and colors of light emitted by the light-emitting devices of the plurality of sub-pixels are different; an orthographic projection of the light shielding layer on a plane where the light-emitting device is located is between light-emitting areas of adjacent light-emitting devices.

For example, in the texture recognition apparatus provided by at least one embodiment of the present disclosure, the display panel further comprises a light filter layer, and the light filter layer is on a side of the sub-pixel array away from the base substrate and comprises a plurality of light filter patterns which respectively allow light of different colors to pass through; the light shielding layer is between adjacent light filter patterns of the plurality of light filter patterns.

For example, in the texture recognition apparatus provided by at least one embodiment of the present disclosure, the display panel further comprises an encapsulation layer on a side of the sub-pixel array away from the base substrate, and the light filter layer and the light shielding layer are on a side of the encapsulation layer away from the base substrate.

For example, in the texture recognition apparatus provided by at least one embodiment of the present disclosure, the display panel further comprises an opposite substrate opposite to the array substrate, and the light filter layer and the light shielding layer are on the opposite substrate.

For example, in the texture recognition apparatus provided by at least one embodiment of the present disclosure, the first opening is in a shape of a ring that is closed or unclosed, and at least a part of the orthographic projection of the first opening on the plane where the image sensor array is located surrounds the first image sensor.

For example, in the texture recognition apparatus provided by at least one embodiment of the present disclosure, the light shielding layer comprises a middle light shielding pattern at a ring center of the ring, and an orthographic projection of the middle light shielding pattern on the plane where the image sensor array is located at least partially overlaps with the first image sensor.

For example, in the texture recognition apparatus provided by at least one embodiment of the present disclosure, an overall planar pattern of the middle light shielding pattern is rectangular, and the planar pattern of the middle light shielding pattern is same as a planar shape of the first image sensor.

For example, in the texture recognition apparatus provided by at least one embodiment of the present disclosure, the middle light shielding pattern comprises a plurality of shielding units, each of the plurality of shielding units is square, a sub-opening is between two adjacent shielding units, and the first opening comprises the sub-opening.

For example, in the texture recognition apparatus provided by at least one embodiment of the present disclosure, the first image sensor comprises a plurality of sensing regions that are in one-to-one correspondence with the plurality of shielding units, for one shielding unit and one sensing region that are in correspondence with each other, an orthographic projection of the one shielding unit on the base substrate at least partially overlaps with an orthographic projection of the one sensing region on the base substrate.

For example, in the texture recognition apparatus provided by at least one embodiment of the present disclosure, a half width of the middle light shielding pattern is $d_b$, a half width of the first image sensor is $d_p$, a width from a center of the middle light shielding pattern to the shielding layer adjacent to the middle light shielding pattern is $d_B$, and a distance from the shielding layer to the image sensor array is h, and $$d_b = \tfrac{1}{2} h * \tan \theta_c,$$

$$d_B = h * \tan \theta_m + d_p,$$

in which θc represents a minimum critical angle of a light path of the texture recognition, and θm represents a maximum critical angle of the light path of the texture recognition.

For example, in the texture recognition apparatus provided by at least one embodiment of the present disclosure, in a case where the overall planar pattern of the middle light shielding pattern is rectangular, the half width of the middle light shielding pattern is in a range of 6 μm-18 μm.

For example, in the texture recognition apparatus provided by at least one embodiment of the present disclosure, the first opening is strip-shaped or block-shaped.

For example, in the texture recognition apparatus provided by at least one embodiment of the present disclosure, the display panel further comprises a touch layer, and the touch layer is configured to have a touch detection function and is on a side of the shielding layer away from the base substrate.

For example, in the texture recognition apparatus provided by at least one embodiment of the present disclosure, the display panel further comprises a touch layer and a polarizer, the touch layer is configured to have a touch detection function and is on a side of the shielding layer away from the base substrate, and the polarizer is on a side of the touch layer close to or away from the base substrate.

For example, in the texture recognition apparatus provided by at least one embodiment of the present disclosure, the display panel further comprises a touch layer, and the touch layer is configured to have a touch detection function and is on a side of the shielding layer close to the base substrate, the touch layer comprises a first touch electrode arranged along a first direction and a second touch electrode arranged along a second direction, the first direction is perpendicular to the second direction; in a direction perpendicular to the base substrate, at least a part of the first touch electrode and at least a part of the second touch electrode overlapping with the at least one opening is transparent.

For example, in the texture recognition apparatus provided by at least one embodiment of the present disclosure, a material of the first touch electrode and a material of the second touch electrode are transparent conductive materials.

For example, in the texture recognition apparatus provided by at least one embodiment of the present disclosure, the first touch electrode and the second touch electrode respectively comprise a plurality of metal wire portions and at least one transparent wire portion, the at least one transparent wire portion electrically connects two adjacent metal wire portions of the plurality of metal wire portions, and an orthographic projection of the at least one transparent wire portion on the base substrate at least partially overlaps with an orthographic projection of the at least one opening on the base substrate.

For example, in the texture recognition apparatus provided by at least one embodiment of the present disclosure, the display panel further comprises a pixel definition layer for defining the plurality of sub-pixels, and the pixel definition layer is configured to filter light with a wavelength greater than 600 nm.

For example, in the texture recognition apparatus provided by at least one embodiment of the present disclosure, the light shielding layer comprises a black light absorption material.

At least one embodiment of the present disclosure further provides an opposite substrate, the opposite substrate has a plurality of light transmission regions in an array, and comprises a light shielding layer, the light shielding layer is between two adjacent light transmission regions of the plurality of light transmission regions for defining the plurality of light transmission regions; the light shielding layer comprises at least one opening to allow light to pass through.

For example, in the opposite substrate provided by at least one embodiment of the present disclosure, the at least one opening is annular, strip-shaped or block-shaped.

For example, the opposite substrate provided by at least one embodiment of the present disclosure further comprises a color filter substrate, the color filter substrate comprises a plurality of light filter patterns that are respectively in the plurality of light transmission regions, and the plurality of light filter patterns respectively allow different colors of light to pass through, the light shielding layer is between two adjacent light filter patterns of the plurality of light filter pattern.

BRIEF DESCRIPTION OF THE DRAWINGS

In order to clearly illustrate technical solutions of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
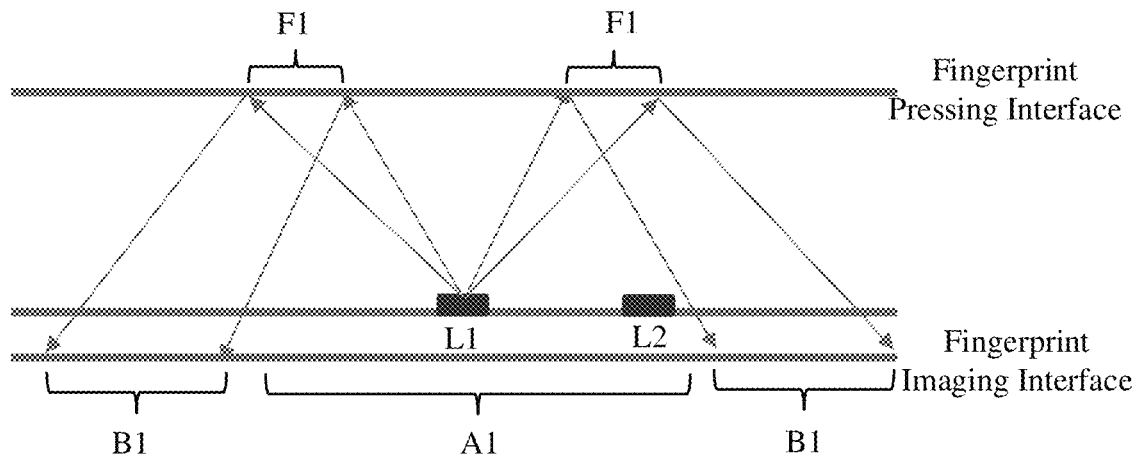
FIG. 1A is a schematic diagram of fingerprint imaging.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

At present, the narrow border is gradually becoming a mainstream for the design and manufacture of a display apparatus, especially for a portable display apparatus such as a mobile phone. One means to realize the narrow border is to integrate image sensors with a fingerprint recognition function into the display apparatus, so as to realize a fingerprint recognition mode under the screen and increases an area of a display region of the display apparatus, and thus increasing the screen proportion.

For example, a point light source, a line light source or a light source with a certain pattern, etc. can be used as a photosensitive light source of an image sensor for fingerprint recognition. In addition, the light source and the image sensor may be arranged in various ways, for example, the light source may be arranged on a side of the image sensor close to the fingerprint touch side, or the light source may be arranged on a same plane as the image sensor, or the light source may also be arranged on a side of the image sensor away from the fingerprint touch side. The arranging modes of the light source and the image sensor can be selected according to different requirements.

The principle of fingerprint recognition is described in the following by taking the case that a point light source is taken as the photosensitive light source of the image sensor, and the light source is arranged on the side of the image sensor close to the fingerprint touch side as an example, but this does not limit the embodiments of the present disclosure.

In a reflective optical fingerprint recognition device, in a fingerprint recognition process, as illustrated in FIG. 1A, when a point light source L1 emits light, the light emitted by the point light source L1 irradiates a fingerprint pressing interface (e.g., an outer surface of a glass screen) at different angles, because of total reflection on the fingerprint pressing interface, a part of the light whose incident angle is larger than or equal to the critical angle θ of the total reflection undergoes total reflection, which results in that this part of the light is not able to exit from the fingerprint pressing interface, thus generating a total reflection region. Correspondingly, a part of the light whose incident angle is smaller than the critical angle θ of the total reflection exits from the fingerprint pressing interface. Therefore, a texture image can be collected by light reflected by the total reflection region, for example, a clear texture image is formed at a region B1 of the fingerprint imaging interface where the image sensor is located, the texture image corresponds to a part of the fingerprint at a region F1, the region F1 is the total reflection region, and the region B1 is an imaging region.

Specifically, for example, when a fingerprint of a user's finger presses the total reflection region F1, ridges of the fingerprint touch a surface of the total reflection region F1, so that the total reflection condition of positions corresponding to the ridges of the fingerprint is destroyed, and therefore light exits at the corresponding positions, so that an original reflection path is changed, while valleys of the fingerprint do not touch the surface of the total reflection region F1, so that the total reflection condition of positions corresponding to the valleys of the fingerprint is not destroyed, and light is still totally reflected at the corresponding positions, and thus the original reflection path is not changed. In this way, the light in the total reflection region causes light incident on the fingerprint imaging interface to form a texture image with alternate bright and dark portions at different positions because of the different influences of the valleys and the ridges of the fingerprint on the total reflection condition.

In addition, because of the interference caused by the light emitted out from the fingerprint pressing interface and then reflected by fingerprints or the like, or because the light emitted by the light source is reflected to the fingerprint imaging interface by other functional layers before reaching the fingerprint pressing interface, a region A1 of the fingerprint imaging interface becomes an invalid detection region, and an effective texture image cannot be formed in this region. In the invalid region A1, a part of the light emitted by the light source L1 and then reflected to the fingerprint imaging interface by other functional layers before reaching the fingerprint pressing interface and a part of the light emitted by the light source L1 that is almost vertically reflected by the fingerprint pressing interface have higher brightness and are basically in a center of the invalid region A1, and therefore a highlight region is formed. Because the highlight region has a higher brightness, a larger photoelectric signal is generated in a part of the image sensor array corresponding to the highlight region, which is easy to form a residual image, thus the highlight region is also known as a residual image region.

Figure 1B:
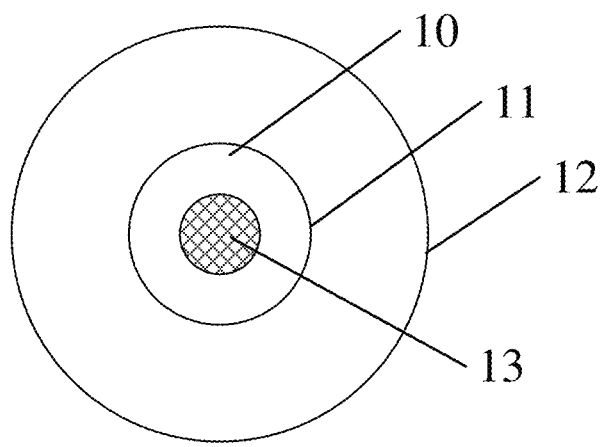
FIG. 1B is a schematic diagram of an imaging range of a point light source.

For example, FIG. 1B illustrates a schematic diagram of an imaging range of a point light source. As illustrated in FIG. 1B, in a photosensitive range of the point light source, an effective imaging range is in a ring shape, that is, in FIG. 1B, a ring region between an inner circle 11 and an outer circle 12 is the effective imaging range which corresponds to the imaging region B1 corresponding to the total reflection region F1 in FIG. 1A; a region (hereinafter referred to as a ring center 10) within the inner circle 11 of the ring shape is the invalid imaging region, which corresponds to the invalid region A1 in FIG. 1A; a part of the region (the shaded region) 13 inside the ring center 10 is the highlight region (residual image region), and it is easy to cause a residual image in the highlight region by the image sensor array during imaging.

Figure 1C:
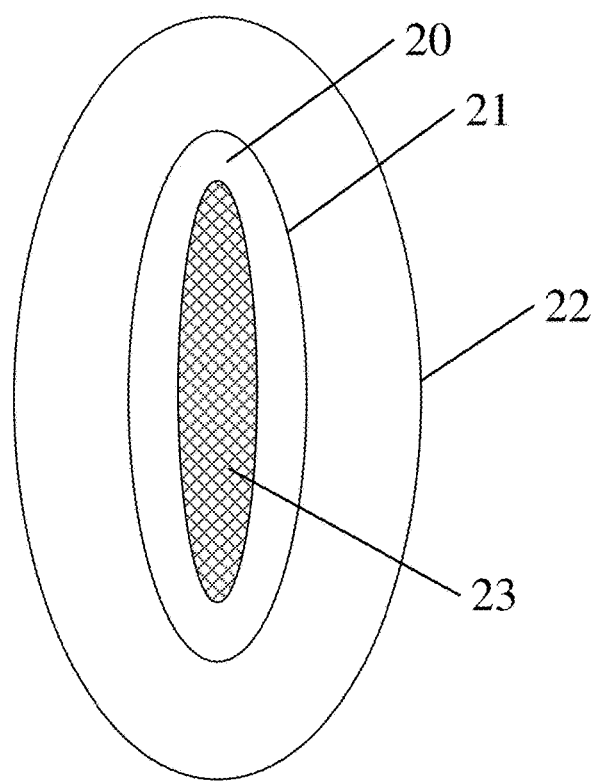
FIG. 1C is a schematic diagram of an imaging range of a line light source.

Similarly, FIG. 1C shows a diagram of an imaging range of a line light source. As illustrated in FIG. 1C, the effective imaging range of a line light source is a racetrack-shaped ring region or a long oval-shaped ring region between an inner circle 21 and an outer circle 22, a ring center 20 is the invalid imaging region, and a part of the region (the shaded region) 23 inside the ring center 10 is the highlight region (residual image region) that is easy to cause a residual image by the image sensor array during imaging.

In addition, in a process of fingerprint recognition, besides the light emitted by the light source can be sensed by the image sensor, the image sensor may also sense the ambient light incident via a finger. Because the image sensor receives light passively and does not actively distinguish the light emitted by the light source array from the ambient light, the ambient light may interfere with the fingerprint recognition of the image sensor, resulting in a blurred image of the texture or even unable to image the texture. In some embodiments, a light blocking component may be provided in the texture imaging device to block ambient light and avoid the influence of strong light on the texture recognition of the image sensor. However, the light blocking component can filter out the ambient light and also affect signal light used for the texture recognition; while ensuring the intensity of the signal light, the effect of filtering out the ambient light is limited, so it is difficult to give consideration to the both.

In addition, in the case where a touch surface of the texture recognition apparatus is provided with a polarizer, the polarizer also affects the signal light, resulting in uneven illumination distribution of the texture recognition image, resulting in a phenomenon of clear textures in some regions and fuzzy textures in some other regions which are even difficult to distinguish.

At least one embodiment of the present disclosure provides a texture recognition apparatus, which includes a light source array, an image sensor array and a light shielding layer. The light source array includes a plurality of light sources; the image sensor array includes a plurality of image sensors, the plurality of image sensors are configured to receive light that is emitted from the plurality of light sources and reflected to the plurality of image sensors by a texture, for texture image collection, and the plurality of image sensors include a first image sensor; the light shielding layer is on a light incident side of the image sensor array, an orthographic projection of the light shielding layer on a plane where the light source array is located is between two adjacent light sources of the plurality of light sources, and an orthographic projection of the light shielding layer on a plane where the image sensor array is located at least partially overlaps with the plurality of image sensors; the light shielding layer has at least one opening, and the at least one opening is configured to allow the light that is emitted from the plurality of light sources and reflected to the plurality of image sensors by the texture to pass through; the at least one opening includes a first opening, and at least a part of an orthographic projection of the first opening on the plane where the image sensor array is located is at least on one side of the first image sensor or overlaps with the first image sensor. The texture recognition apparatus can ensure the intensity of signal light, while reducing the interference of ambient light and avoiding strong light, thus improving the texture recognition accuracy of the texture recognition apparatus.

At least one embodiment of the present disclosure provides an opposite substrate, the opposite substrate has a plurality of light transmission regions in an array, and includes a light shielding layer, the light shielding layer is between two adjacent light transmission regions of the plurality of light transmission regions for defining the plurality of light transmission regions; the light shielding layer includes at least one opening to allow light to pass through. The opposite substrate can be used in a texture recognition apparatus, such as a display panel with a texture recognition function, so as to ensure the intensity of signal light, reduce the interference of ambient light, avoid strong light, and further improve the texture recognition accuracy of the texture recognition apparatus.

The texture recognition apparatus and the opposite substrate provided by embodiments of the present disclosure are described in detail without limitation by several specific embodiments.

Figure 2A:
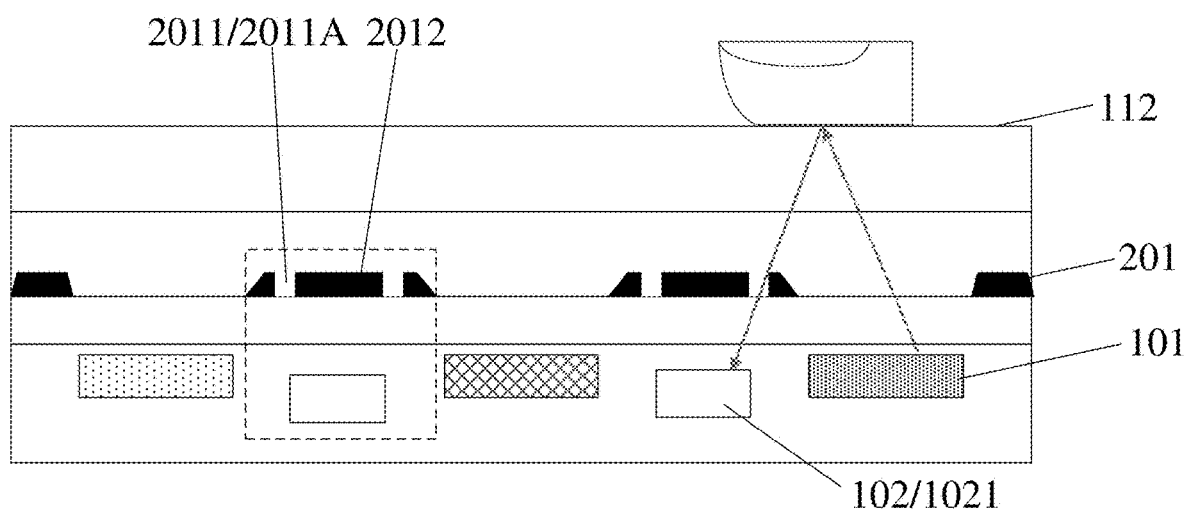
FIG. 2A is a schematic cross-sectional view of a texture recognition apparatus provided by at least one embodiment of the present disclosure.
Figure 3A:
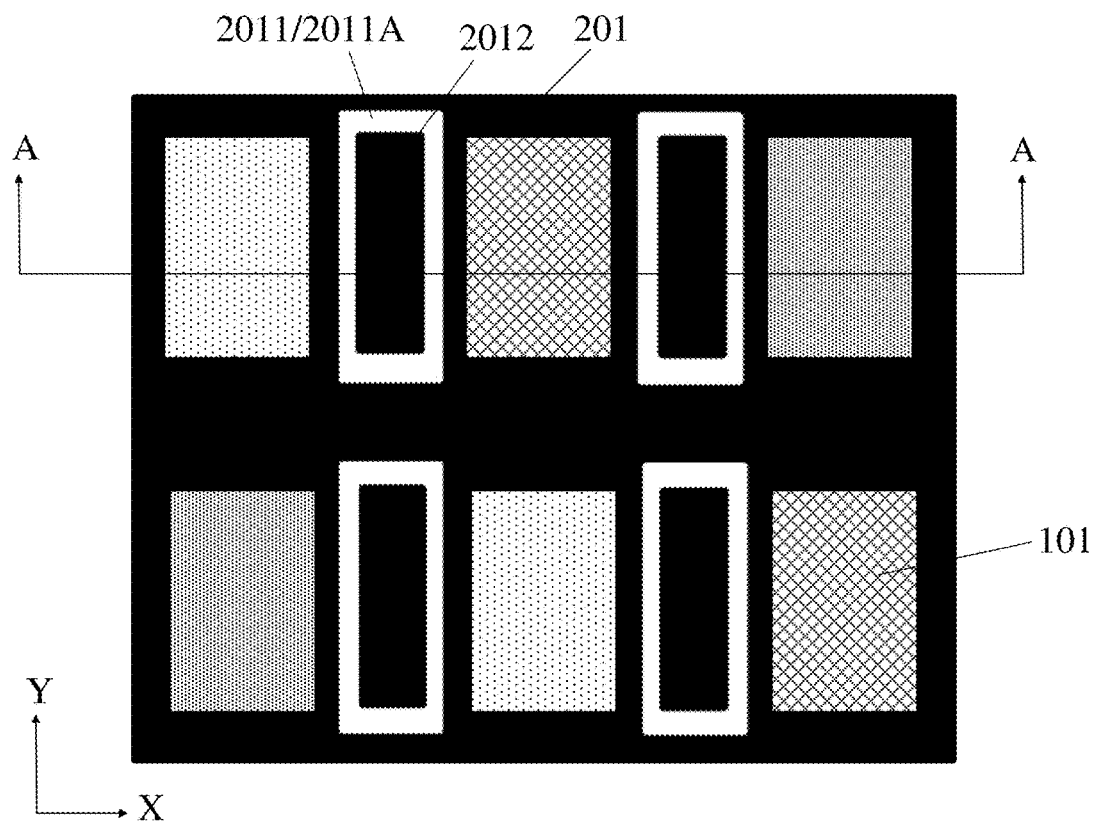
FIG. 3A is a schematic planar view of a texture recognition apparatus provided by at least one embodiment of the present disclosure.

FIG. 2A is a schematic cross-sectional view of a texture recognition apparatus provided by some embodiments of the present disclosure; FIG. 3A is a schematic planar view of the texture recognition apparatus provided in this embodiment, and for example, FIG. 2A is obtained by taking along the line A-A in FIG. 3A.

For example, as illustrated in FIG. 2A and FIG. 3A, the texture recognition apparatus has a touch side 112 (illustrated as the upper side of the texture recognition apparatus in FIG. 1A), and includes a light source array, an image sensor array and a light shielding layer 201. The texture recognition apparatus can be used to collect a texture (such as a fingerprint or a palm print) for texture recognition.

For example, the light source array includes a plurality of light sources 101 arranged in an array within a predetermined region. The image sensor array includes a plurality of image sensors 102, and the plurality of image sensors 102 are configured to receive light emitted from the plurality of light sources 101 and reflected to the plurality of image sensors 102 by a texture, for texture image collection; the plurality of image sensors 102 includes a first image sensor 1021, that is, one or more image sensors of the plurality of image sensors 102, which is(are) referred to as the first image sensor(s) 1021 in the following descriptions. The light shielding layer 201 is arranged on a light incident side of the image sensor array (illustrated as the upper side of the image sensor array in the figure). An orthographic projection of the light shielding layer 201 on a plane where the light source array is located is between two adjacent light sources 101 of the plurality of light sources 101, and an orthographic projection of the light shielding layer 201 on a plane where the image sensor array is located at least partially overlaps with the plurality of image sensors 102. The light shielding layer 201 has at least one opening 2011, and the at least one opening 2011 is configured to allow light emitted from the plurality of light sources 101 and then reflected by the texture to pass through; the at least one opening 2011 includes a first opening 2011A, and at least a part of an orthographic projection of the first opening 2011A on the plane where the image sensor array is located is on at least one side of the first image sensor 1021 or overlaps with the first image sensor 1021.

For example, in some embodiments, the light shielding layer 201 has a plurality of first openings 2011A, and the plurality of the first openings 2011A are in one-to-one correspondence with the plurality of image sensors 102, and for one first opening 2011A and one image sensor 102 that are in one-to-one correspondence with each other, at least a part of the orthographic projection of the one first openings 2011A on the plane where the image sensor array is located is on at least one side of the one image sensor 102 or overlaps with the one image sensor 102. The light shielding layer 201 in the texture recognition apparatus can shield at least part of ambient light and reduce adverse effects of strong light, and at the same time, the at least one opening 2011 of the light shielding layer can transmit signal light for effective imaging of the image sensors, so that the texture recognition apparatus can reduce interference of ambient light and strong light, and ensure intensity of signal light at the same time, thereby improving texture recognition accuracy of the texture recognition apparatus.

For example, in some embodiments, for one first opening 2011A and one image sensor 102 that are in one-to-one correspondence with each other, an overlapping area of the orthographic projection of the one first opening 2011A on the plane where the image sensor array is located and the one image sensor 102 is less than 50% of an area occupied by the one image sensor on the plane where the image sensor array is located, such as less than 60% or 70% or the like. That is, an overlapping area of the orthographic projection of the light shielding layer 201 on the plane where the image sensor array is located and the one image sensor 102 is greater than 50% of the area occupied by the one image sensor 102 on the plane where the image sensor array is located, such as greater than 60% or 70% or the like. Therefore, the light shielding layer 201 with the opening 2011 can reduce the interference of ambient light and strong light and ensure the intensity of the signal light.

Referring to FIG. 2A, when an operator with a texture, such as a finger, touches the touch side 112 of the texture recognition apparatus, the light emitted by the light sources 101 can be reflected by the operator, for example, the light reaches the image sensors 102 through the opening 2011 in the light shielding layer 201, and the image sensors 102 can collect the texture image of the operator by sensing the light.

As mentioned above, the operator with a texture may be a hand, and in this case, the texture identified by the image sensor 102 is a skin texture, such as a fingerprint, a palm print, etc. In addition, the operator with a texture may be a non-living body with a certain texture, for example, an object with a certain texture made of resin or other materials, which is not specifically limited by the embodiments of the present disclosure.

For example, in some embodiments, the image sensor array may be disposed on a side of the light source array away from the touch side 112. For example, in other embodiments, the image sensor array may be arranged in a same layer as the light source array, for example, the plurality of image sensors 102 included in the image sensor array and the plurality of light sources 101 included in the light source array are arranged at intervals in the same layer. For another example, the light source array may be provided on a side of the image sensor array away from the touch side, and in this case, the light emitted by the light sources 101 may be emitted from the interval between adjacent image sensors 102 and then reflected to the image sensors 102 by the texture. For another example, the image sensor array can be separately prepared as a detection chip and then installed on one side of the texture recognition apparatus.

The embodiments of the present disclosure do not specifically limit the arrangement of the image sensor array and the light source array, as long as the plurality of image sensors 102 can receive the light emitted from the light sources 101 and reflected to the image sensors 102 by the texture for texture collection.

Figure 4A:
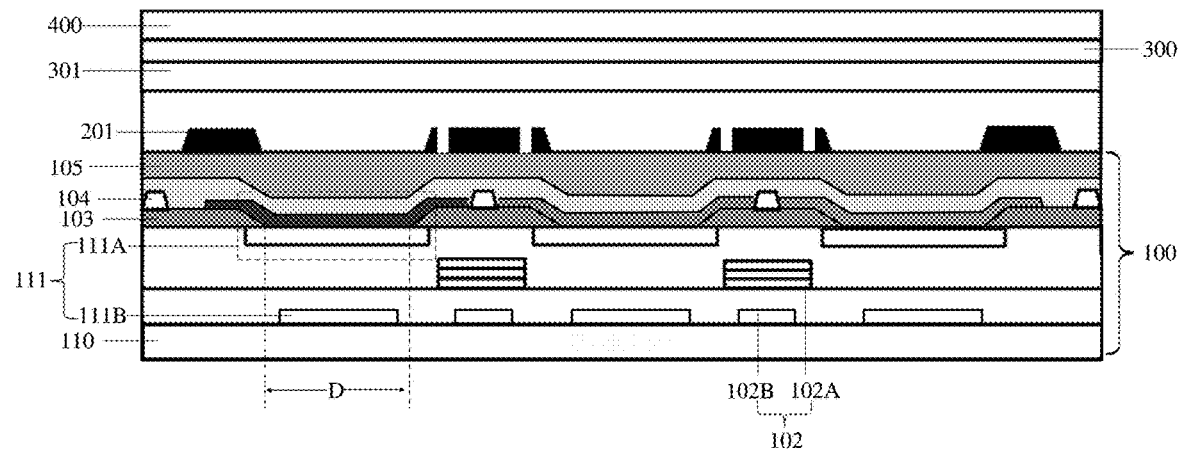
FIG. 4A is a schematic cross-sectional view of another texture recognition apparatus provided by at least one embodiment of the present disclosure.

For example, in some embodiments, as illustrated in FIG. 4A, the texture recognition apparatus is, for example, a display apparatus with an under-screen texture recognition function, and the display apparatus correspondingly includes a display panel. For example, as illustrated in FIG. 4A, the display panel includes an array substrate 100, the array substrate 100 includes a base substrate 110 and a sub-pixel array disposed on the base substrate 110, the sub-pixel array includes a plurality of sub-pixels 111; for example, the light source array includes the sub-pixel array, and the plurality of light sources 101 include the plurality of sub-pixels 111. Therefore, the sub-pixel array of the display panel is configured to realize the light source array, and the plurality of sub-pixel units 111 are configured to realize the plurality of light sources 101. That is, at least a part of sub-pixels 111 of the display panel also serve as the light sources 101, so that the compactness of the display apparatus can be improved and the arrangement difficulty of each functional structure can be reduced.

For example, one or more sub-pixels of the plurality of sub-pixels 111 may be lit (emit light) at the same time for forming a photosensitive light source with a certain shape, for example, forming a point-shaped light source, a line-shaped light source or other patterned light source. For example, in some examples, a plurality of sub-pixels 111 arranged in an array of 7×7 (i.e., an array arrangement of 7 rows and 7 columns) may be lit at the same time to form a point-shaped photosensitive light source; for example, a plurality of sub-pixels 111 arranged in an array of 8×8 (i.e., an array arrangement of 8 rows and 8 columns) may be lit alternately to form a point-shaped photosensitive light source with low brightness; for another example, a plurality of sub-pixels 111 arranged in an array of 3×7 (i.e., an array arrangement of 3 rows and 7 columns) may be lit at the same time to form a linear-shaped photosensitive light source.

For example, the sub-pixels 111 in the whole display region of the display panel may be controlled to serve as the light sources 101, and the image sensor array may be correspondingly arranged below the whole display region, thereby realizing full-screen texture recognition.

For example, in other embodiments, the display apparatus with the under-screen texture recognition function includes a display panel and light-emitting devices separately provided as photosensitive light sources for realizing the texture recognition, and these light-emitting devices are, for example, arranged between adjacent sub-pixels in the sub-pixel array or overlapped with the sub-pixels, which is not limited by the embodiments of the present disclosure.

For example, each sub-pixel 111 of the display substrate includes a light-emitting device 111A and a pixel driving circuit for driving the light-emitting device 111A, the light-emitting device 111A includes a cathode, an anode and a light-emitting layer between the cathode and the anode, and the pixel driving circuit includes a switch element 111B (e.g., a thin film transistor), a storage capacitor (not illustrated), etc. For example, each image sensor 102 includes a sensing element 102A and a switch element 102B (such as a thin film transistor) for driving the sensing element 102A. For example, the plurality of image sensors 102 and the plurality of sub-pixels 111 may be jointly formed on the same array substrate 100 by a semiconductor process. For example, in the case where the sub-pixel array or a part of the sub-pixel array serves as the light source array, the signal switch element 102B of the image sensor 102 may be formed together with the switch element 111B of the sub-pixel in a same process, thereby simplifying the preparation process, reducing the cost and enabling the thickness of the device to be thinner.

For example, in some embodiments, the light-emitting devices 111A of the plurality of sub-pixels 111 may emit light with different colors (for example, respectively emit red light, blue light and green light), and an orthographic projection of the light shielding layer 201 on a plane where the light-emitting devices 111A are located is between light-emitting regions D of adjacent light-emitting devices 111A. Therefore, the display panel can realize color display, and the light shielding layer 201 can prevent crosstalk of light emitted from the light-emitting devices 111A of the plurality of sub-pixels 111, thereby improving the display quality of the display panel.

Figure 2B:
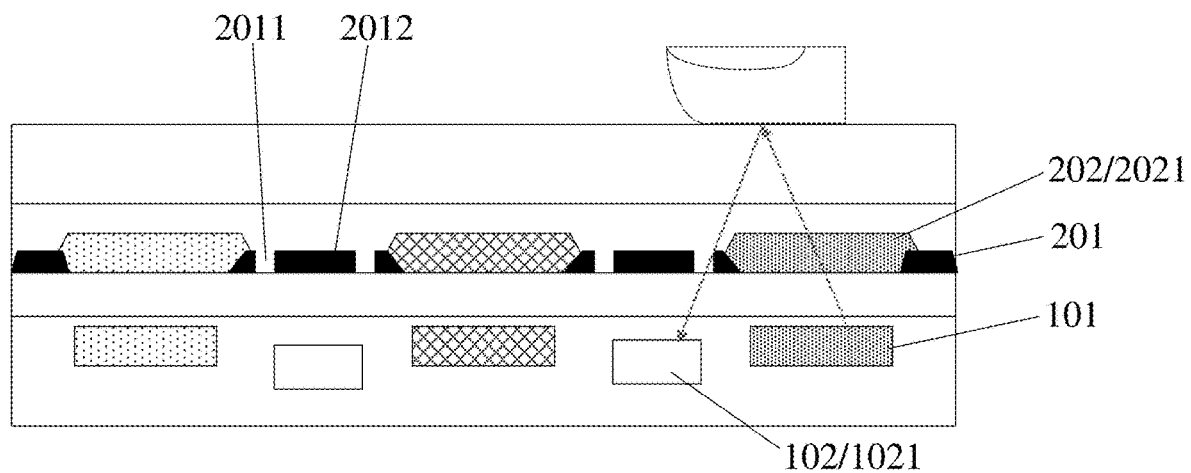
FIG. 2B is a schematic cross-sectional view of another texture recognition apparatus provided by at least one embodiment of the present disclosure.
Figure 5:
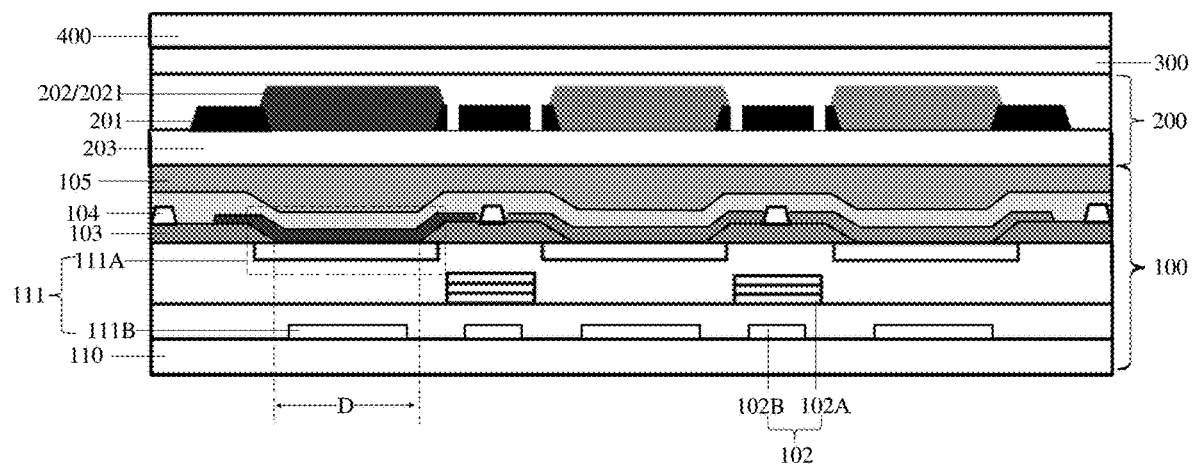
FIG. 5 is a schematic cross-sectional view of another texture recognition apparatus provided by at least one embodiment of the present disclosure.

For example, in some embodiments, as illustrated in FIG. 2B and FIG. 5, the display panel may further include a light filter layer 202 on a side of the sub-pixel array away from the base substrate 110. For example, the light filter layer 202 includes a plurality of light filter patterns 2021 respectively allowing light of different colors to pass through; the light shielding layer 201 is disposed between adjacent light filter patterns 2021.

For example, in the case where the colors of the light emitted by the plurality of sub-pixels 111 are different, the plurality of light filter patterns 2021 are arranged in one-to-one correspondence with the plurality of sub-pixels 111, and for one light filter pattern 2021 and one sub-pixel 111 that are in correspondence with each other, the color of light emitted by the one sub-pixel 111 is same as the color of light that can transmit through the one light filter pattern 2021, thereby improving the purity of monochromatic light emitted by each sub-pixel 111. For example, in other embodiments, the plurality of sub-pixels 111 may all emit white light, and the white light passes through the plurality of light filter patterns 2021 that respectively allow different colors of light to pass through, and then forms color monochromatic light (such as red light, blue light and green light), thereby realizing color display.

In the above embodiments of the present disclosure, the light filter layer 202 and the light shielding layer 201 can replace polarizers commonly used in a display panel to improve light transmittance and reduce light loss; in this case, a polarizer may not be provided in the display panel, thereby avoiding the interference of the polarizer to the signal light used for texture recognition, and further improving the texture recognition accuracy.

For example, in some embodiments, as illustrated in FIG. 4A, the display panel further includes an encapsulation layer 105 disposed on a side of the sub-pixel array away from the base substrate 110, and the light shielding layer 201 is disposed on a side of the encapsulation layer 105 away from the base substrate 110. For example, in some embodiments, the display panel further includes a light filter layer 202 disposed in the same layer as the light shielding layer 201, and the light shielding layer 201 is disposed between adjacent light filter patterns 2021 of the light filter layer 202. In this case, the light shielding layer 201 and the light filter layer 202 are disposed on the side of the encapsulation layer 105 away from the base substrate 110, referring to FIG. 2B and FIG. 4B. For example, in a manufacturing process of the display panel, the light shielding layer 201 and the light filter layer 202 may be directly fabricated on the encapsulation layer 105.

Figure 4B:
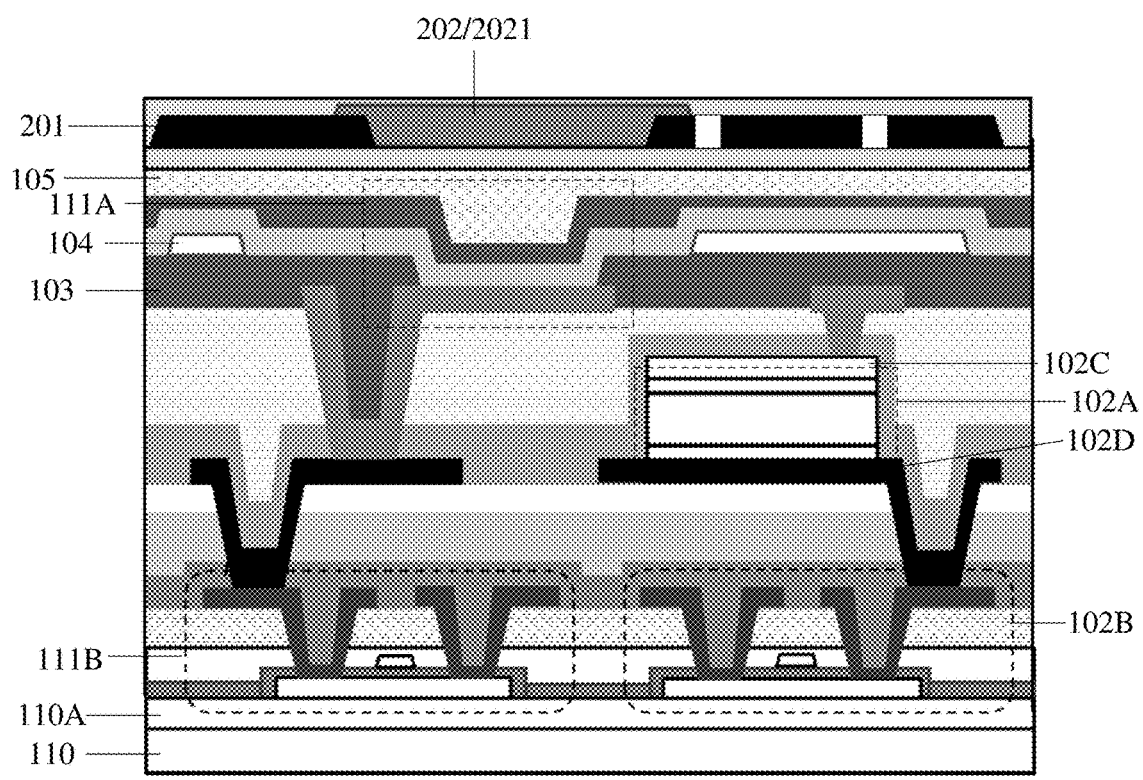
FIG. 4B is a schematic cross-sectional view of further another texture recognition apparatus provided by at least one embodiment of the present disclosure.

For example, as illustrated in FIG. 4B, the switch element 111B included in the pixel driving circuit of each sub-pixel may be a thin film transistor, which includes an active layer, a gate electrode, a source electrode, a drain electrode and other structures. For example, the switch element 102B of each image sensor 102 may also be a thin film transistor, which includes an active layer, a gate electrode, a source electrode, a drain electrode and other structures. For example, the switch element 111B and the switch element 102B may be arranged in the same layer, that is, the switch element 111B and the switch element 102B are formed by the same material layer and by the same patterning process in the manufacture process, thereby simplifying the manufacture process of the display panel. For example, the switch element 102B of the image sensor 102 is disposed between the switch elements 111B of adjacent sub-pixels, and the photosensitive element 102A of the image sensor 102 is disposed between the light-emitting devices 111A of adjacent sub-pixels. In this way, the image sensors 102 are integrated in the display panel.

For example, in other embodiments, the display panel may further include an opposite substrate that is opposite to the array substrate 100, and the light shielding layer 201 is disposed on the opposite substrate. The opposite substrate is connected to the array substrate 100 through an adhesive layer. For example, the array substrate 100 and the opposite substrate are separately and independently manufactured substrates, and are connected oppositely to form the display panel. For example, in the embodiment illustrated in FIG. 5, the light filter layer 202 and the light shielding layer 201 may both be disposed on the opposite substrate 200, and the opposite substrate 200 is connected to the array substrate 100 through the adhesive layer 203.

For example, the display panel may be an Organic Light-emitting Diode (OLED) display panel or a Quantum Dot Light-emitting Diode (QLED) display panel, etc., which is not specifically limited by embodiments of the present disclosure. The OLED display panel may be, for example, a flexible OLED display panel. For example, the OLED display panel and the QLED display panel have self-luminous characteristics, and the light emission of the display pixel units of the OLED display panel and the QLED display panel can be controlled or modulated as required, which can provide convenience for texture collection and help to improve the integration of the texture recognition apparatus.

For example, in addition to the sub-pixel array, the display panel further includes signal lines (including gate lines, data lines, detection lines, etc.) for providing electrical signals (including scanning signals, data signals, detection signals, etc.). For example, a light emission state of the light-emitting device can be controlled by the driving circuit to realize the lighting of the sub-pixels. For example, a protection cover plate 400 is further provided on the display panel, and a surface of the protection cover plate 400 forms the touch side 112. The protection cover plate 400 is made of a transparent material such as glass, polyimide, and the like. For example, in some embodiments, the display panel further has functional layers such as a touch layer and a polarizer layer, and so on, and these functional layers may be combined on the display panel by an optical transparent adhesive (OCA adhesive).

For example, as illustrated in FIG. 4A, FIG. 4B and FIG. 5, the display panel may further include a pixel definition layer 103, a spacer 104, an encapsulation layer 105 and other structures disposed on the base substrate 110. The pixel definition layer 103 is configured to define the plurality of sub-pixels, the spacer 104 is configured to form a sealed space, and the encapsulation layer 105 is configured to encapsulate the array substrate 100. For example, the encapsulation layer 105 may include a stack of a plurality of inorganic encapsulation layers and organic encapsulation layers.

Because in the process of fingerprint recognition, besides the light emitted by the light source array can be sensed by the image sensor array, the image sensor array may also sense ambient light incident through the finger. The ambient light may interfere with the fingerprint recognition of the image sensors. For example, when the ambient light shines directly above the finger, the ambient light can penetrate the finger and excite biological tissue in the finger to emit pigment light, and the pigment light may interfere with the fingerprint recognition. Through detection, the pigment light mainly includes light with a wavelength greater than 600 nm.

For example, in some embodiments, the pixel definition layer 103 is further configured to filter light with a wavelength greater than 600 nm, such as filter out light with a wavelength in a range of 600 nm-900 nm. For example, a material of the pixel definition layer 103 includes an organic resin material doped with a colored dye, so that the pixel definition layer 103 has a certain filtering effect on light with a wavelength in a range of 600 nm to 900 nm. The colored dye includes, for example, a bromamine acid derivative and the like. Therefore, by the cooperation of the light shielding layer 201 and the pixel definition layer 103, the influence of the ambient light and strong light on the image sensors can be avoided, and the accuracy of texture recognition can be improved.

For example, in other embodiments, the adopted image sensor 102 may not respond to infrared light with a wavelength greater than 900 nm, thus further avoiding the interference of the ambient light/pigment light on the image sensors.

For example, in some embodiments, the image sensor 102 may be a charge coupled device (CCD) image sensor, a complementary metal oxide semiconductor (CMOS) image sensor, a photodiode (such as a PIN photodiode, etc.), or other suitable types of image sensors. According to needs, the image sensor 102 can only sense light with a certain wavelength (such as red light or green light), or can sense all visible light.

For example, in the embodiments illustrated in FIGS. 4A, 4B and 5, the image sensor 102 may be a PIN photodiode, and the PIN photodiode includes a P-type semiconductor layer (such as a P-type Si layer), an intrinsic semiconductor layer (such as an intrinsic Si layer) and an N-type semiconductor layer (such as an N-type Si layer) that are stacked. For example, the PIN photodiode may be directly formed on the array substrate 100 by a semiconductor process. For example, as illustrated in FIG. 4B, the upper side and the lower side of the image sensor 102 are respectively provided with an electrode 102C and an electrode 102D for driving the image sensor 102 and realizing the circuit connection.

For example, in some embodiments, the light shielding layer 201 includes a black light absorption material, so that the light shielding layer 201 is formed in a form of a black matrix to achieve a light shielding effect.

For example, in some embodiments, as illustrated in FIG. 3A, the opening 2011 in the light shielding layer 201, for example, the first opening 2011A, is in a shape of a ring that is closed or unclosed. For example, the ring may be a square ring (as illustrated in FIG. 3A) or an annular ring (e.g., a generally circular ring or an elliptical ring, as illustrated in FIG. 3C), etc., and the embodiments of the present disclosure do not limit the specific shape of the first opening 2011A. For example, at least a part of the orthographic projection of the first opening 2011A on the plane where the image sensor array is located surrounds the first image sensor 1021. For example, in the example illustrated in FIG. 3A, the orthographic projection of the first opening 2011A on the plane where the image sensor array is located is in a shape of a closed ring and completely surrounds the first image sensor 1021.

For example, as illustrated in FIG. 3A, the light shielding layer 201 includes a middle light shielding pattern 2012 located in a ring center of the ring, and an orthographic projection of the middle light shielding pattern 2012 on the plane where the image sensor array is located at least partially overlaps with the first image sensor 1021. For example, in some examples, the orthographic projection of the middle light shielding pattern 2012 on the plane where the image sensor array is located completely overlaps with the first image sensor 1021, that is, the middle light shielding pattern 2012 and the first image sensor 1021 have a same shape and a same size; or, in some examples, the orthographic projection of the middle light shielding pattern 2012 on the plane where the image sensor array is located is within the first image sensor 1021, for example, the middle light shielding pattern 2012 shrinks in equal proportion along edges of the first image sensor 1021; or, in some examples, an orthographic projection of the first image sensor 1021 on the light shielding layer 201 is within the middle light shielding pattern 2012, for example, the middle light shielding pattern 2012 is scaled up in equal proportion along the edges of the first image sensor 1021. In this case, as illustrated in FIG. 4A and FIG. 5, the middle light shielding pattern 2012 is located right above the first image sensor 1021, and can shade the ambient light and prevent the image sensor 102 from being exposed to strong light. Moreover, the first opening 2011A in the light shielding layer 201 can transmit the signal light used for effective imaging, so as to be used for texture collection of the image sensor 102.

For example, in some embodiments, the middle light shielding pattern 2012 has a same planar shape as the first image sensor 1021. For example, in the embodiment illustrated in FIG. 3A, an overall planar pattern of the middle light shielding pattern 2012 is rectangular, and a planar shape of the first image sensor 1021 is the same as the planar pattern of the middle light shielding pattern 2012, and is also rectangular.

For example, in some examples, an overlapping area of an orthographic projection of the middle light shielding pattern 2012 on the plane where the image sensor array is located and the image sensor 1021 is greater than or equal to 50% of the area occupied by the image sensor 1021.

Figure 6A:
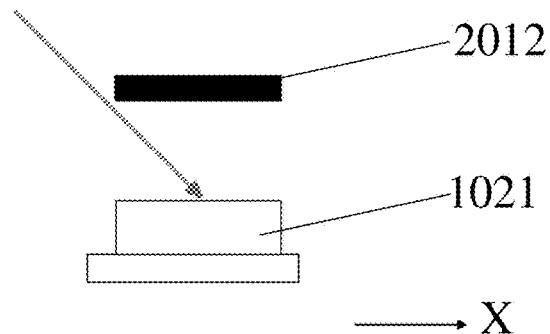
FIG. 6A is a schematic cross-sectional view, taken along a first direction, of a middle light shielding pattern and a first image sensor in a texture recognition apparatus provided by at least one embodiment of the present disclosure.
Figure 6B:
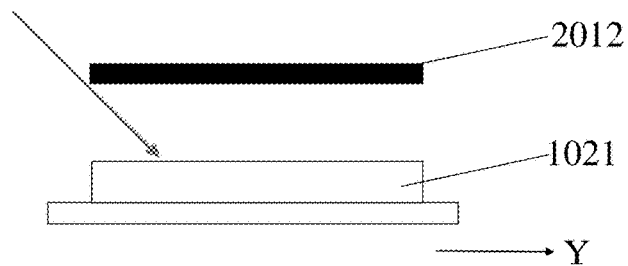
FIG. 6B is a schematic cross-sectional view, taken along a second direction, of the middle light shielding pattern and the first image sensor in a texture recognition apparatus provided by at least one embodiment of the present disclosure.

For example, in the direction X in FIG. 3A, the sizes of the middle light shielding pattern 2012 and the first image sensor 1021 are smaller, and in this case, as illustrated in FIG. 6A, the signal light used for effective imaging can be sufficiently incident into each part of the first image sensor 1021. For example, in the direction Y in FIG. 3A, the sizes of the middle light shielding pattern 2012 and the first image sensor 1021 are larger, and in this case, as illustrated in FIG. 6B, it may be difficult for the signal light used for effective imaging to enter a middle part of the first image sensor 1021.

Figure 3B:
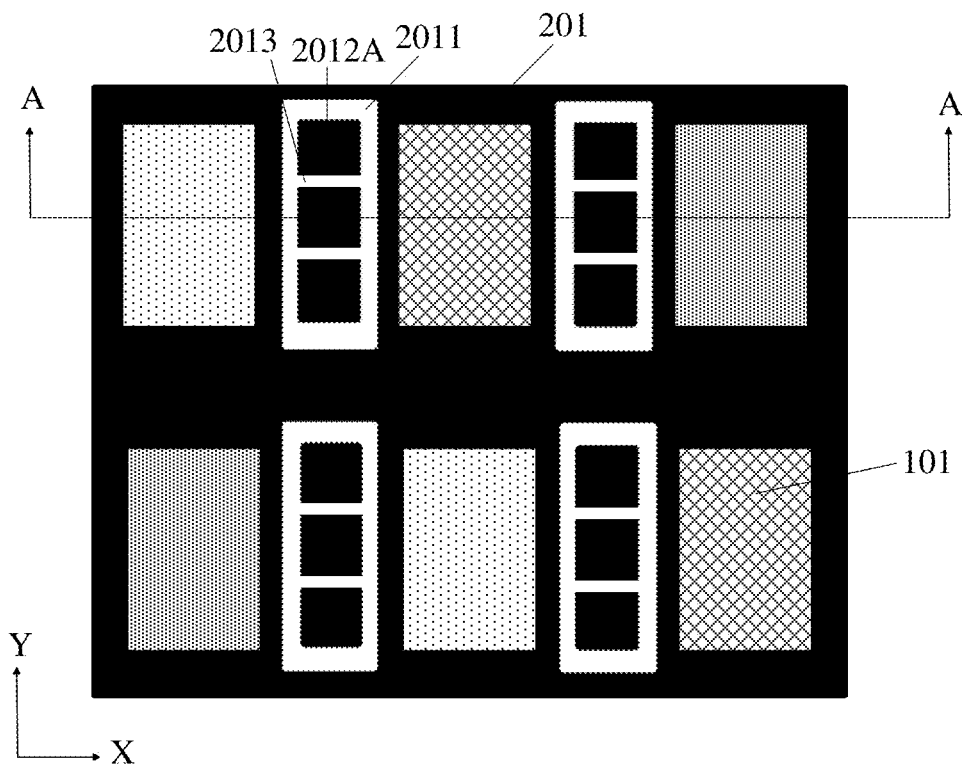
FIG. 3B is a schematic planar view of another texture recognition apparatus provided by at least one embodiment of the present disclosure.
Figure 3C:
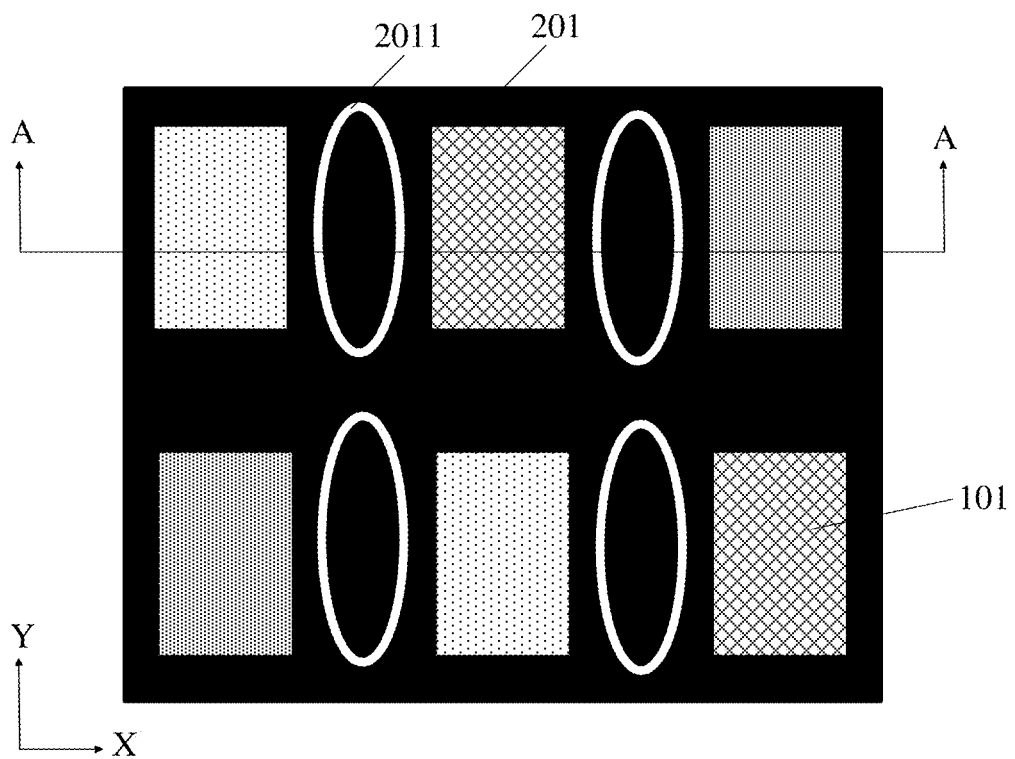
FIG. 3C is a schematic planar view of further another texture recognition apparatus provided by at least one embodiment of the present disclosure.
Figure 7A:
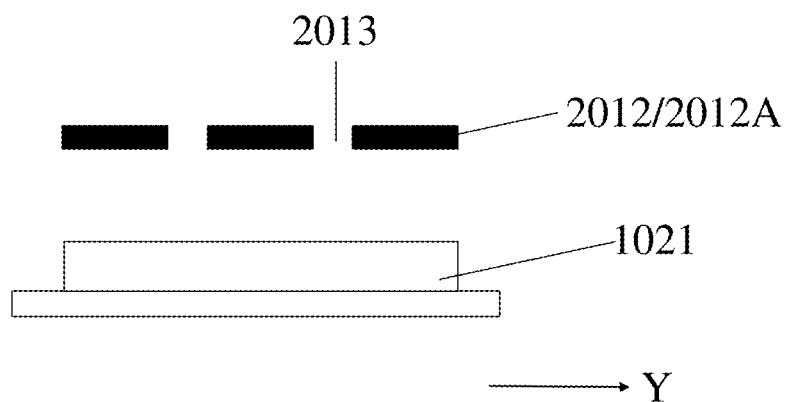
FIG. 7A is another schematic cross-sectional view, taken along the second direction, of the middle light shielding pattern and the first image sensor in a texture recognition apparatus provided by at least one embodiment of the present disclosure.

For example, in some embodiments, as illustrated in FIG. 3B and FIG. 7A, the middle light shielding pattern 2012 may include a plurality of light shielding units 2012A, each light shielding unit 2012A is square, a sub-opening 2013 is provided between two adjacent light shielding units 2012A, and the first opening 2011 includes the sub-opening 2013. Therefore, the signal light used for effective imaging can be sufficiently incident into the first image sensor 1021 through the first opening 2011 (including the sub-opening 2013) from all directions for texture collection by the first image sensor 1021.

It should be noted that, in the embodiments of the present disclosure, the pattern of each light shielding unit 2012A may deviate from the standard square because of structural setting or manufacturing accuracy, and therefore a rectangle with a size difference between length and width within 20% or a square with a chamfer, etc., are regarded as "square" described in the embodiments of the present disclosure.

Figure 7B:
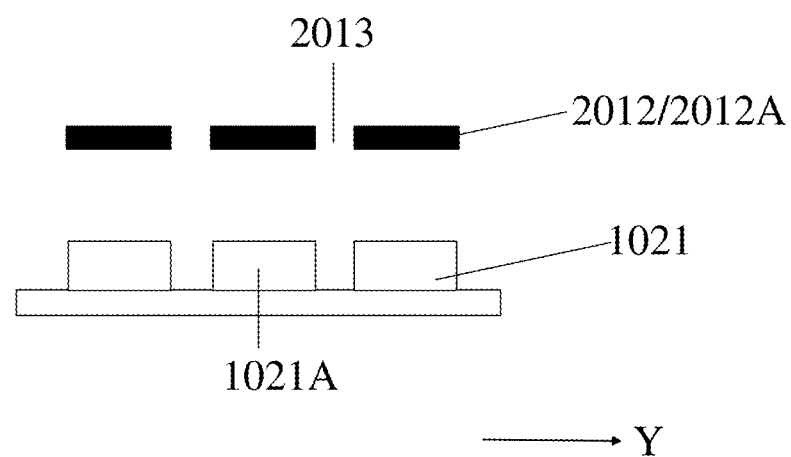
FIG. 7B is further another schematic cross-sectional view, taken along the second direction, of the middle light shielding pattern and the first image sensor in a texture recognition apparatus provided by at least one embodiment of the present disclosure.

For example, in some embodiments, the first image sensor 1021 itself may be designed with partitions (subareas). For example, as illustrated in FIG. 7B, the first image sensor 1021 includes a plurality of sensing regions 1021A that are in one-to-one correspondence with the plurality of light shielding units 2012A, and the plurality of sensing regions 1021A are controlled by the same switch element and driven by the same electrodes, so as to realize the function of one image sensor. For example, for one light shielding unit 2012A and one sensing region 1021A that are in one-to-one correspondence with each other, an orthographic projection of the one light shielding unit 2012A on the base substrate 110 at least partially overlaps with an orthographic projection of the one sensing region 1021A on the base substrate 110. Therefore, the signal light used for effective imaging can be fully incident into each sensing region 1021A of the first image sensor 1021 through the first opening 2011 (including the sub-opening 2013) from all directions, so as to be jointly used for texture collection of the first image sensor 1021.

Figure 8:
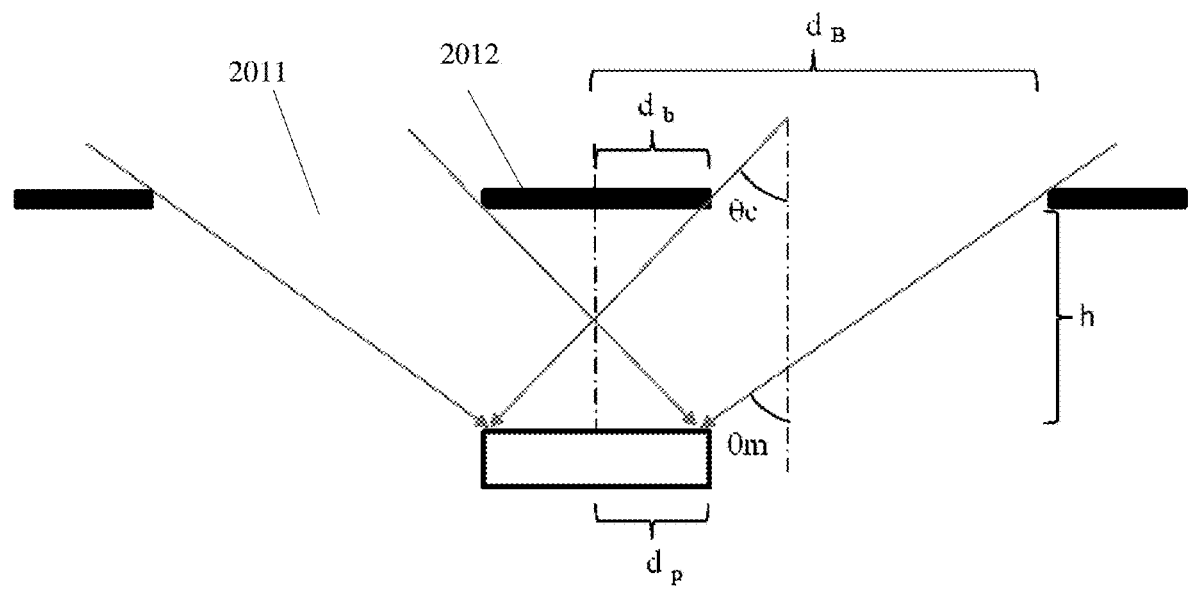
FIG. 8 is an optical path diagram showing light transmission of a first opening in a texture recognition apparatus provided by at least one embodiment of the present disclosure.

For example, in some embodiments, the size of the middle light shielding pattern 1012 and the size of the opening 2011 can be calculated. For example, as illustrated in FIG. 8, the half width of the middle light shielding pattern 1012 is $d_b$, the half width of the first image sensor 1021 is $d_p$, the width from the center of the middle light shielding pattern 1012 to the light shielding layer adjacent to the middle light shielding pattern 1012 is $d_B$, and the distance from the light shielding layer 201 to the image sensor array is h, then:

$$d_b = \frac{1}{2} h^* \tan \theta_c,$$

$$d_B = h^* \tan \theta_m + d_p,$$

in which $\theta_c$ represents a minimum critical angle of a light path for texture recognition, and $\theta_m$ represents a maximum critical angle of the light path for texture recognition. For example, $\theta_c$ is determined by the refractive index of the protection cover plate 400, and $\theta_c$ is the critical angle of total reflection of the protection cover plate 400. For example, in one example, the refractive index of the protection cover plate 400 is 1.53, the critical angle of total reflection $\theta_c$ is approximately 41°. For example, $\theta_m$ is determined by the intensity of the signal light and the responsivity of the first image sensor 1021, and for example, in some examples, $\theta_m$ is in a range of 60°-80°, such as 70°. According to the above formula, the half width $d_b$ of the middle light shielding pattern 1012 can be calculated, and in this case, the width of the opening 2011 is in a range of $d_B - d_b$.

It should be noted that in the case where the planar pattern of the middle light shielding pattern 1012 is a rectangle, the half width $d_b$ of the middle light shielding pattern 1012 is half of the length or half of the width of the rectangle at the cross-sectional position; in the case where the planar pattern of the middle light shielding pattern is a circle, the half width of the middle light shielding pattern is the radius of the circle at the cross-sectional position; in the case where the planar pattern of the middle light shielding pattern is an ellipse, the half width of the middle light shielding pattern is half of the major axis or half of the minor axis of the ellipse. The half width $d_p$ of the first image sensor 1021 is the same.

For example, when the product parameters are determined, the half width of the middle light shielding pattern 1012 may be designed to be not less than the half width $d_b$ calculated above. The larger the half width of the middle light shielding pattern 1012, the stronger the shading ability of the middle light shielding pattern 1012, but the middle light shielding pattern 1012 may also shade more signal light. The width from the center of the middle light shielding pattern 1012 to the light shielding layer adjacent to the middle light shielding pattern 1012 may be designed to be not larger than the $d_B$ calculated above, and the smaller the width from the center of the middle light shielding pattern 1012 to the light shielding layer adjacent to the middle light shielding pattern 1012, the smaller the intensity of the signal light.

For example, in some embodiments, in the case that the overall planar pattern of the middle light shielding pattern 1012 is rectangular, the half width of the middle light shielding pattern 1012 may be designed in a range of 6 μm-18 μm. In this case, the light shielding layer 201 can effectively shade at least a part of the ambient light and reduce the adverse effects of strong light, and can also ensure the intensity of the signal light. For example, in one example, the distance between the light source array and the image sensor array is about 1 mm, the half width $d_p$ of the first image sensor 1021 is about 10 μm, the distance h between the light shielding layer 201 and the image sensor array is about 23 μm, and the half width $d_b$ of the middle light shielding pattern is calculated to be about 10 μm. In this case, the half width of the middle light shielding pattern 1012 may be designed to be not less than 10 μm.

For example, in other embodiments, the opening 2011 (for example, the first opening 2011A) of the light shielding layer 201 may be strip-shaped or block-shaped. For example, as illustrated in FIG. 9A, the light shielding layer 201 has at least one strip-shaped or block-shaped opening 2011 between the corresponding adjacent light sources 101 (or adjacent sub-pixels 111) to allow the signal light to pass through and reach the image sensors 102.

Figure 9A:
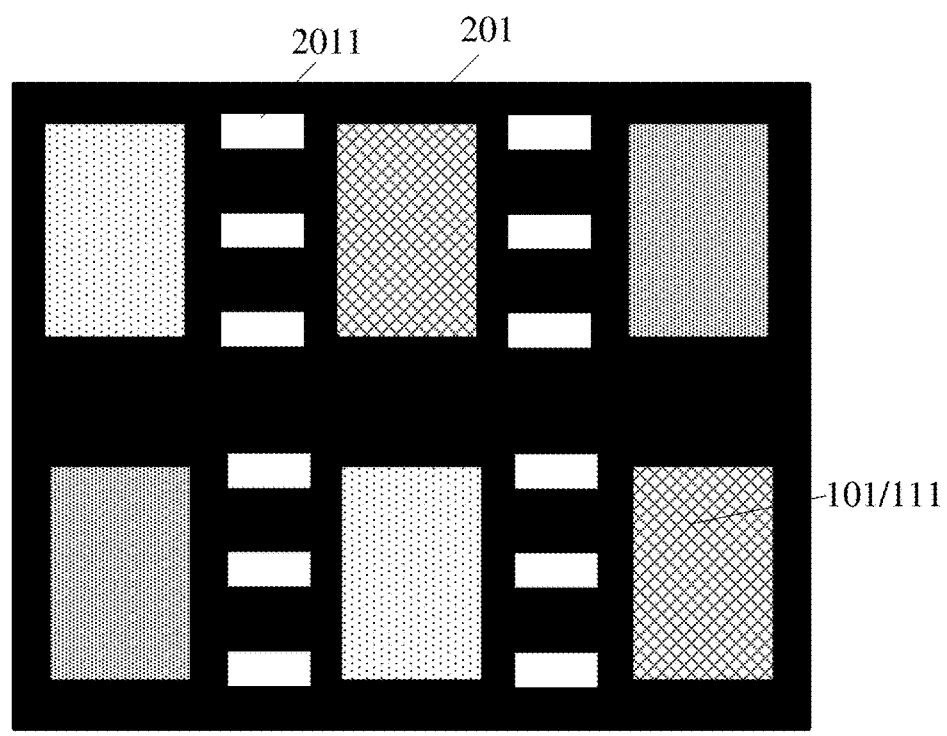
FIG. 9A is a schematic planar view of further another texture recognition apparatus provided by at least one embodiment of the present disclosure.
Figure 9B:
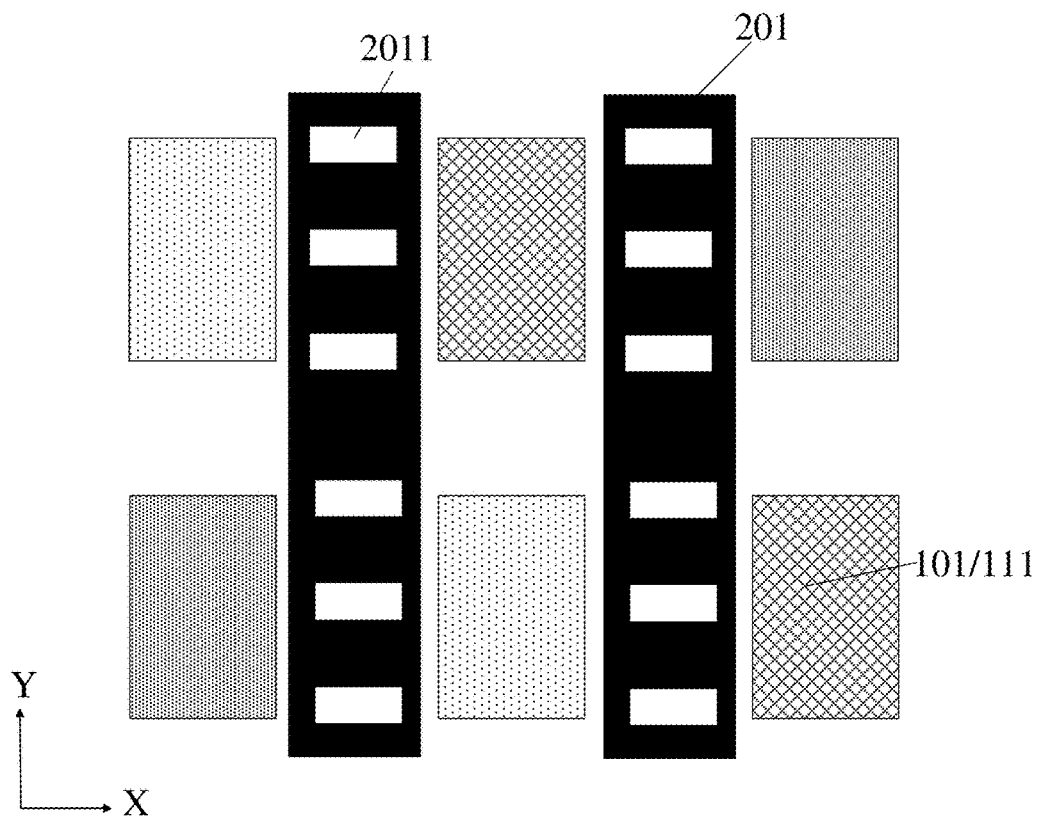
FIG. 9B is a schematic planar view of further another texture recognition apparatus provided by at least one embodiment of the present disclosure.
Figure 9C:
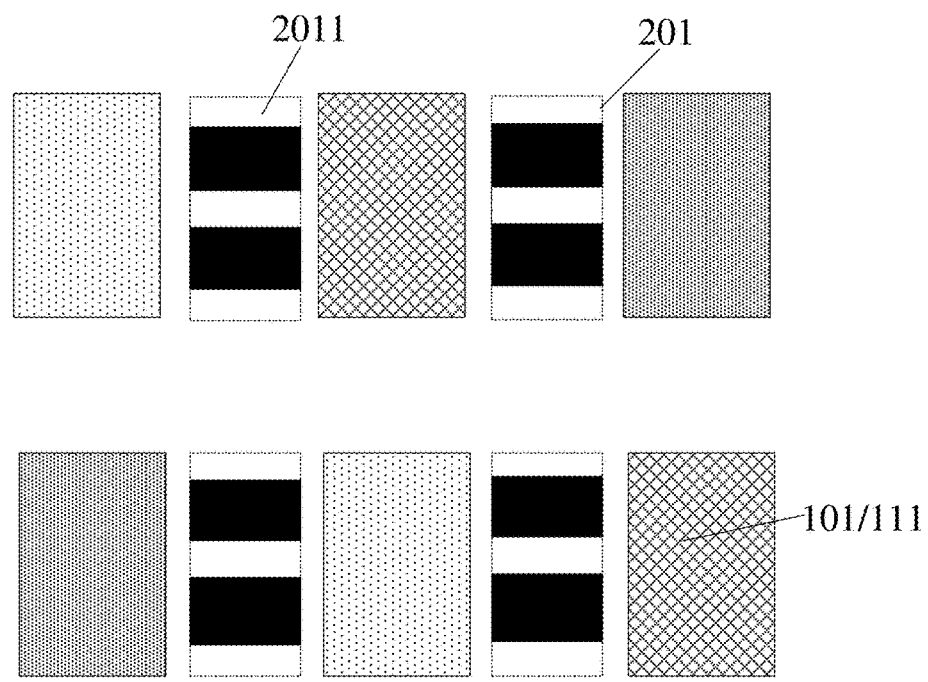
FIG. 9C is a schematic plan view of further another texture recognition apparatus provided by at least one embodiment of the present disclosure.

For example, in the embodiment illustrated in FIG. 9A, the light shielding layer 201 is correspondingly arranged between two adjacent rows of light sources 101 (or sub-pixels 111) and between two adjacent columns of light sources 101 (or sub-pixels 111), thereby forming a mesh-like light shielding layer 201. For example, in other embodiments, as illustrated in FIG. 9B, the light shielding layer 201 may be correspondingly arranged only between two adjacent columns of light sources 101 (or sub-pixels 111), thereby forming a strip-shaped light shielding layer 201, the strip-shaped light shielding layer 201 has at least one opening 2011 between adjacent light sources 101 (or adjacent sub-pixels 111). For another example, in some embodiments, as illustrated in FIG. 9C, the light shielding layer 201 may be distributed between adjacent light sources 101 (or adjacent sub-pixels 111) in a shape of blocks, and has at least one opening 2011 between the corresponding adjacent light sources 101 (or sub-pixels 111).

It should be noted that the above definitions of rows and columns are interchangeable. For example, in the case where the texture recognition apparatus in the figure rotates, the rows and columns of the light sources 101 (or sub-pixels 111) also change.

The embodiments of the present disclosure do not specifically limit the arrangement mode of the light shielding layer 201 and the arrangement mode of the opening 2011 in the light shielding layer 201, as long as the light shielding layer 201 can shade at least a part of ambient light and reduce the adverse effects of strong light, and the opening 2011 in the light shielding layer 201 allows the signal light used for effective imaging to pass through. The light shielding layer 201 and the opening 2011 in the light shielding layer 201 in different arrangement modes have different degrees of shading at least a part of ambient light and strong light and allowing the signal light to pass through. For example, relatively speaking, the embodiment illustrated in FIG. 9A can more fully shade ambient light and avoid strong light, but may also shade some signal light; the embodiment of FIG. 9C can shade a part of ambient light and avoid strong light, but can fully allow the signal light to pass through. Therefore, the light shielding layer 201 and the opening 2011 in the light shielding layer 201 may be designed according to the structure of the display panel and different needs.

For example, in some embodiments, the display panel may further include a touch layer, and the touch layer is configured to have a touch detection function, and for example, the touch layer includes a touch sensor. The embodiments of the present disclosure do not limit the type of the touch sensor, for example, the type of the touch sensor may be resistance type, capacitance type, surface acoustic wave type, etc., which is not described in detail here. For example, as illustrated in FIG. 5, the touch layer 300 is on the side of the light shielding layer 201 away from the base substrate 110. Therefore, an on-cell touch layer display panel is realized. The display panel has a light shielding layer 201 and a light filter layer 201, so that the light transmittance can be improved and the light loss can be reduced without a polarizer. In addition, the display panel is not provided with a polarizer, which can avoid the interference of the polarizer on the signal light for texture recognition, and further improve the accuracy of texture recognition.

For example, in other embodiments, in the case where the display panel does not have a light filter layer, as illustrated in FIG. 4A, the display panel may further include a polarizer 301, the touch layer 300 is located on the side of the light shielding layer 201 away from the base substrate 110, and the polarizer 301 is arranged on the side of the touch layer 300 close to or away from the base substrate 110. Therefore, the on-cell touch layer display panel can also be realized.

Figure 10:
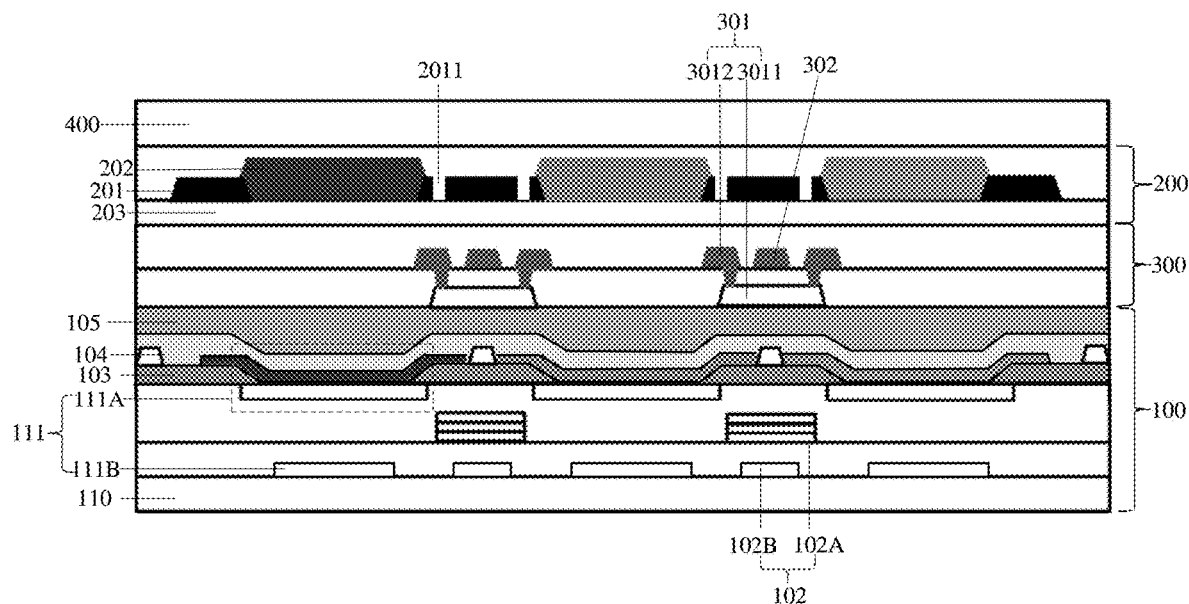
FIG. 10 is a schematic cross-sectional view of further another texture recognition apparatus provided by at least one embodiment of the present disclosure.

For example, in other embodiments, as illustrated in FIG. 10, the touch layer 300 is located on the side of the light shielding layer 201 close to the base substrate 110, and in this case, the touch layer 300 is disposed between the array substrate 100 and the opposite substrate 200, for example. In this way, an in-cell touch layer display panel is formed. For example, the touch layer 300 includes a first touch electrode 301 arranged along the first direction X and a second touch electrode 302 arranged along the second direction Y, and the first direction is perpendicular to the second direction; in a direction perpendicular to the base substrate 100, at least a part of the first touch electrode and at least a part of the second touch electrode overlapping with the opening 2011 are transparent. In this way, the touch layer 300 cannot affect the propagation of the signal light used for texture recognition.

Figure 11A:
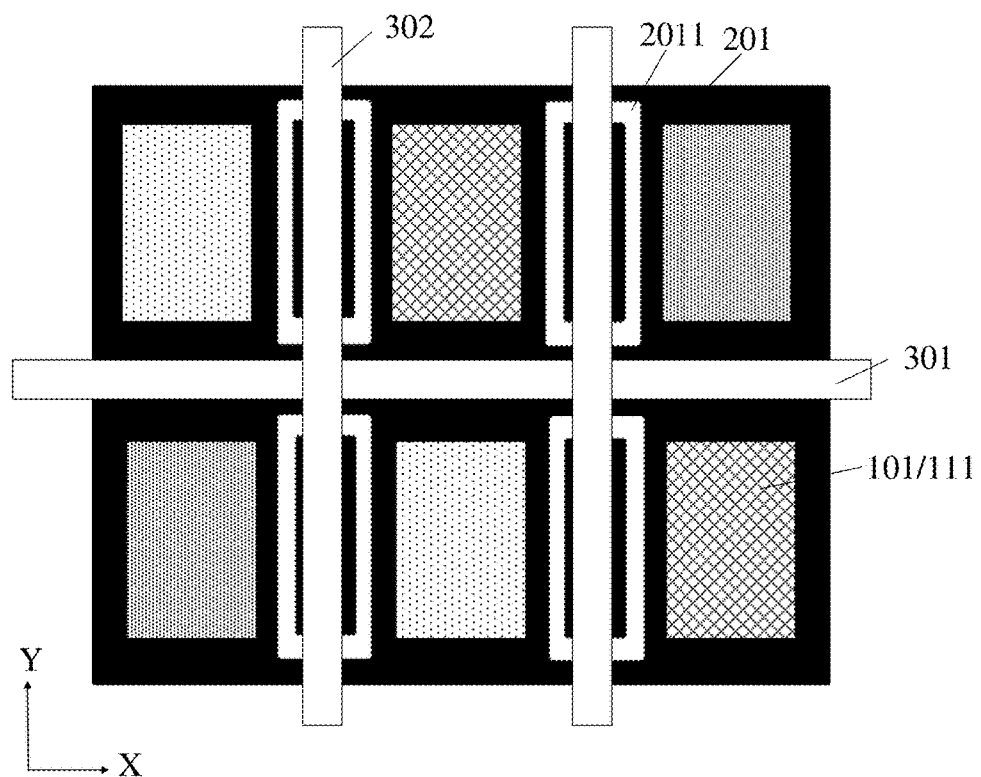
FIG. 11A is a schematic planar view of further another texture recognition apparatus provided by at least one embodiment of the present disclosure.

For example, in the embodiment illustrated in FIG. 11A, a material of the first touch electrode 301 and a material of the second touch electrode 302 are transparent conductive materials. Therefore, the whole of the first touch electrode 301 and the second touch electrode 302 transmits light. For example, the transparent conductive material includes a transparent metal oxide such as indium tin oxide (ITO), indium zinc oxide (IZO) and so on.

Figure 11B:
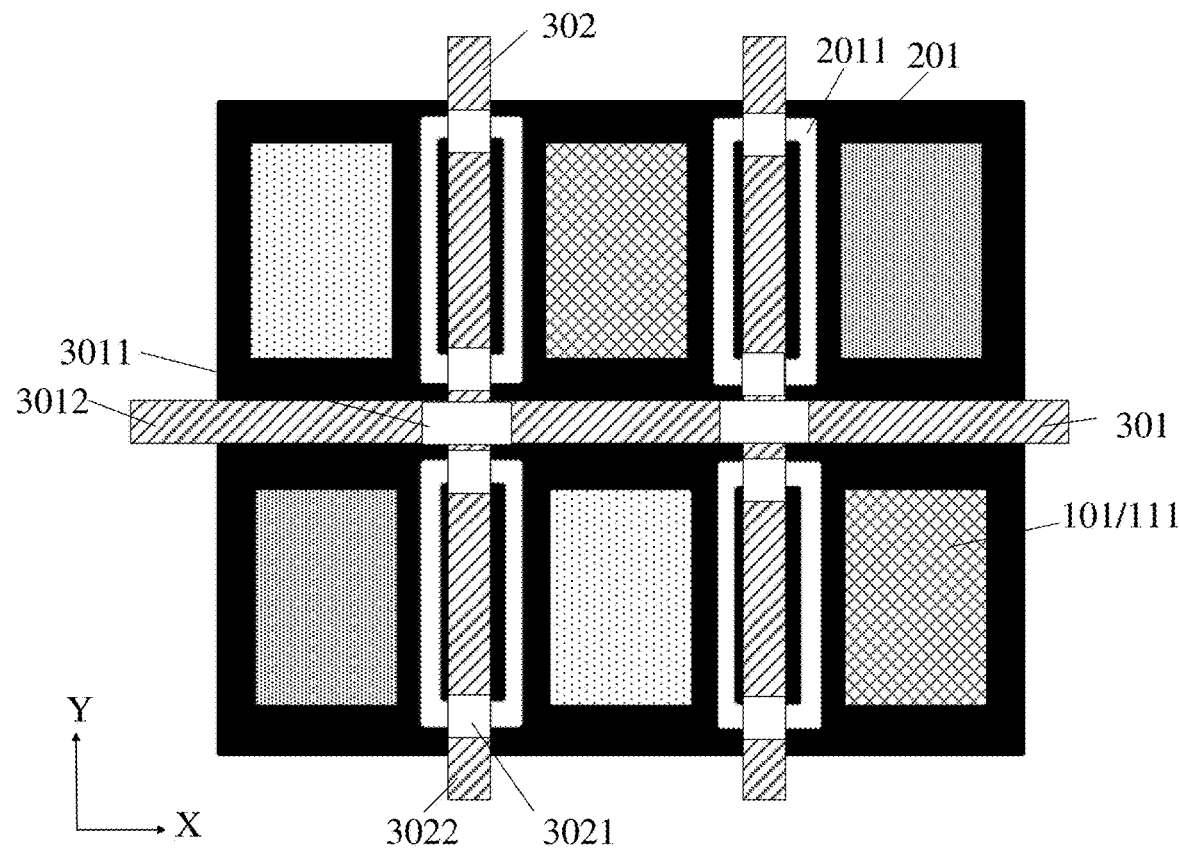
FIG. 11B is a schematic plan view of another texture recognition apparatus provided by at least one embodiment of the present disclosure.

For example, in the embodiment illustrated in FIG. 11B, combined with FIG. 10, the first touch electrode 301 includes a plurality of metal wire portions 3011 and at least one transparent wire portion 3012, the transparent wire portion 3012 electrically connect two adjacent metal wire portions 3011, and an orthographic projection of the transparent wire portion 3012 on the base substrate 110 at least partially overlaps with the orthographic projection of the opening 2011 on the base substrate 110. For example, the second touch electrode 302 includes a plurality of metal wire portions 3021 and at least one transparent wire portion 3022, the transparent wire portion 3022 electrically connect two adjacent metal wire portions 3021, and the orthographic projection of the transparent wire portion 3022 on the base substrate 110 at least partially overlaps with the orthographic projection of the opening 2011 on the base substrate 110. Therefore, a part of the first touch electrode 301 and a part of the second touch electrode 302 overlapping with the opening 2011 are transparent, and thus the propagation of the signal light used for texture recognition is not affected.

For example, a material of the metal wire portions 3011 and 3021 is a metal material such as copper, molybdenum and aluminum or an alloy thereof, and a material of the transparent wire portions 3012 and 3022 is a transparent conductive material, for example, a transparent metal oxide such as ITO, IZO, and so on.

It should be noted that the planar views illustrated in FIG. 11A and FIG. 11B only show the relative positions of the first touch electrode 301 and the second touch electrode 302 in the display panel, but do not show the specific structures thereof.

Figure 12A:
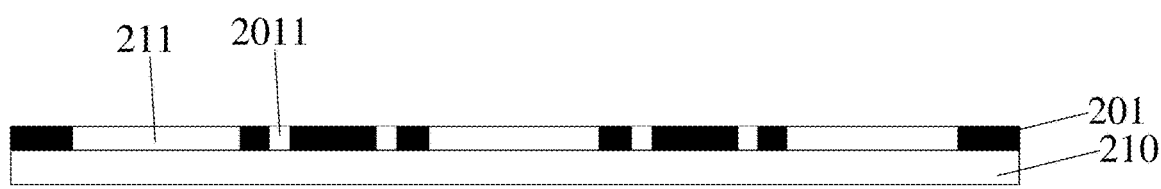
FIG. 12A is a schematic cross-sectional view of an opposite substrate provided by at least one embodiment of the present disclosure.
Figure 13:
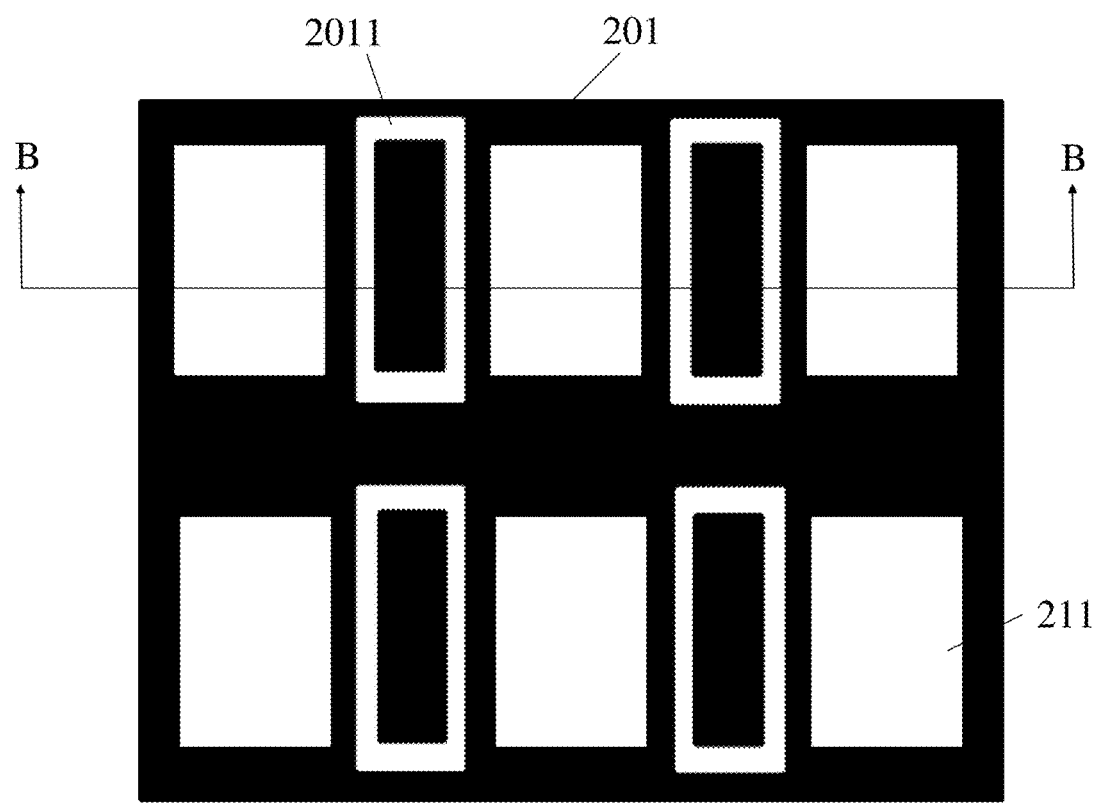
FIG. 13 is a schematic planar view of an opposite substrate provided by at least one embodiment of the present disclosure.

At least one embodiment of the present disclosure further provides an opposite substrate, FIG. 12A shows a schematic cross-sectional view of the opposite substrate and FIG. 13 shows a schematic planar view of the opposite substrate, and FIG. 12A is taken along the line B-B in FIG. 13.

As illustrated in FIG. 12A and FIG. 13, the opposite substrate 200 has a plurality of light transmission regions 211 arranged in an array, and in the case where the opposite substrate 200 is used for connecting with the array substrate, the light transmission regions 211 are used for transmitting light emitted by the plurality of sub-pixels. The opposite substrate 200 includes a light shielding layer 201, and the light shielding layer 201 is disposed between two adjacent light transmission regions 211 for defining the plurality of light transmission regions 2011. For example, the light shielding layer 201 includes at least one opening 2011, for example, includes a plurality of the openings 2011 to allow light to pass through.

For example, in some embodiments, the opening 2011 of the light shielding layer 201 may be annular, strip-shaped or block-shaped, and the specific forms can be seen in FIGS. 3A-3C and FIGS. 9A-9C, and are not described here again.

Figure 12B:
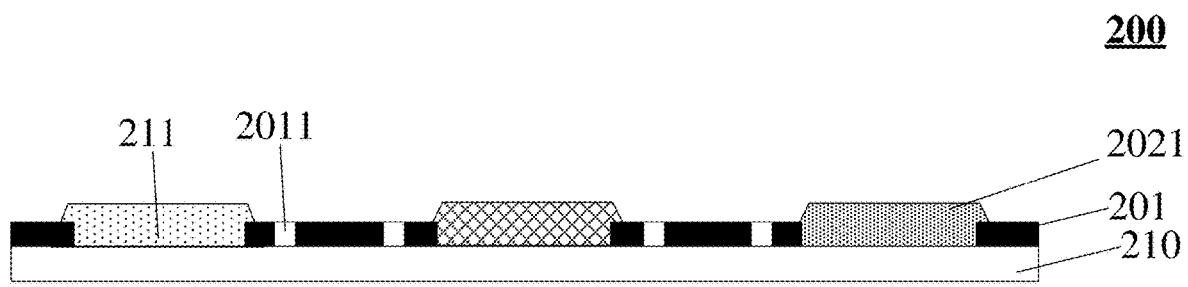
FIG. 12B is a schematic cross-sectional view of another opposite substrate provided by at least one embodiment of the present disclosure.

For example, in some embodiments, the opposite substrate 200 is a color filter substrate, as illustrated in FIG. 12B, the color filter substrate includes a plurality of light filter patterns 2021 respectively located in the plurality of light transmission regions 211, and the plurality of light filter patterns respectively allow light of different colors to pass through. In this case, the light shielding layer 201 is disposed between two adjacent light filter patterns 2021. When the color filter substrate is used to be connected with the array substrate to form the display panel, the display panel does not need to be provided with a polarizer, thereby avoiding the adverse influence of the polarizer on the texture recognition of the display panel. The embodiments of the disclosure do not limit the specific structure and type of the array substrate connected with the above-mentioned color filter substrate.

The following several statements should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a region may be enlarged or reduced, that is, the drawings are not drawn in an actual scale. It should understood that, in the case that a component such as a layer, film, region, substrate or the like is referred to be "on" or "under" another component, it may be directly on or under the another component or a component is interposed therebetween.

(3) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, the protection scope of the present disclosure should be determined by the protection scope of the claims.

What is claimed is:

1. A texture recognition apparatus, comprising:
a light source array, comprising a plurality of light sources;
an image sensor array, comprising a plurality of image sensors, wherein the plurality of image sensors are configured to receive light that is emitted from the plurality of light sources and reflected to the plurality of image sensors by a texture for texture image collection, and the plurality of image sensors comprise a first image sensor; and
a light shielding layer, on a light incident side of the image sensor array, wherein an orthographic projection of the light shielding layer on a plane where the light source array is located is between two adjacent light sources of the plurality of light sources, and an orthographic projection of the light shielding layer on a plane where the image sensor array is located at least partially overlaps with the plurality of image sensors,
wherein the light shielding layer has at least one opening, and the at least one opening is configured to allow the light that is emitted from the plurality of light sources and reflected to the plurality of image sensors by the texture to pass through, the at least one opening comprises a first opening, and at least a part of an orthographic projection of the first opening on the plane where the image sensor array is located is on at least one side of the first image sensor or overlaps with the first image sensor,
the first opening is in a shape of a ring that is closed, and at least a part of the orthographic projection of the first opening on the plane where the image sensor array is located surrounds the first image sensor,
the light shielding layer comprises a middle light shielding pattern at a ring center of the ring, and an orthographic projection of the middle light shielding pattern on the plane where the image sensor array is located at least partially overlaps with the first image sensor,
a half width of the middle light shielding pattern is $d_b$, a half width of the first image sensor is $d_p$, a width from a center of the middle light shielding pattern to the shielding layer adjacent to the middle light shielding pattern is $d_B$, and a distance from the shielding layer to the image sensor array is h, and $d_b = \frac{1}{2} h * \tan \theta_c,$ $d_B = h * \tan \theta_m + d_p,$ in which $\theta_c$ represents a minimum critical angle of a light path for texture recognition, and $\theta_m$ represents a maximum critical angle of the light path for texture recognition.

2. The texture recognition apparatus according to claim 1, wherein the at least one opening comprises a plurality of first openings, and the plurality of first openings are in one-to-one correspondence with the plurality of image sensors,
for one first opening and one image sensor that are in correspondence with each other, at least a part of an orthographic projection of the one first opening on the plane where the image sensor array is located is on at least one side of the one image sensor or overlaps with the one image sensor.

3. The texture recognition apparatus according to claim 2, wherein for one first opening and one image sensor that are in correspondence with each other, an overlapping area of an orthographic projection of the one first opening on the plane where the image sensor array is located and the one image sensor is less than 50% of an area occupied by the one image sensor on the plane where the image sensor array is located.

4. The texture recognition apparatus according to claim 1, wherein the texture recognition apparatus comprises a display panel, the display panel comprises an array substrate, the array substrate comprises a base substrate and a sub-pixel array on the base substrate, and the sub-pixel array comprises a plurality of sub-pixels,
the light source array comprises the sub-pixel array, and the plurality of light sources comprise the plurality of sub-pixels.

5. The texture recognition apparatus according to claim 4, wherein each of the plurality of sub-pixels comprises a light-emitting device, and colors of light emitted by the light-emitting devices of the plurality of sub-pixels are different, and
wherein an orthographic projection of the light shielding layer on a plane where the light-emitting device is located is between light-emitting areas of adjacent light-emitting devices.

6. The texture recognition apparatus according to claim 4, wherein the display panel further comprises a light filter layer, and the light filter layer is on a side of the sub-pixel array away from the base substrate and comprises a plurality of light filter patterns which respectively allow light of different colors to pass through, and
wherein the light shielding layer is between adjacent light filter patterns of the plurality of light filter patterns.

7. The texture recognition apparatus according to claim 6, wherein the display panel further comprises an encapsulation layer on a side of the sub-pixel array away from the base substrate, and
the light filter layer and the light shielding layer are on a side of the encapsulation layer away from the base substrate; or
the display panel further comprises an opposite substrate opposite to the array substrate, and the light filter layer and the light shielding layer are on the opposite substrate.

8. The texture recognition apparatus according to claim 6, wherein the display panel further comprises a touch layer, and the touch layer is configured to have a touch detection function and is on a side of the shielding layer away from the base substrate.

9. The texture recognition apparatus according to claim 4, wherein the display panel further comprises a touch layer and a polarizer,
the touch layer is configured to have a touch detection function and is on a side of the shielding layer away from the base substrate, and the polarizer is on a side of the touch layer close to or away from the base substrate.

10. The texture recognition apparatus according to claim 4, wherein the display panel further comprises a touch layer, and the touch layer is configured to have a touch detection function and is on a side of the shielding layer close to the base substrate,
the touch layer comprises a first touch electrode arranged along a first direction and a second touch electrode arranged along a second direction, the first direction is perpendicular to the second direction, and
in a direction perpendicular to the base substrate, at least a part of the first touch electrode and at least a part of the second touch electrode overlapping with the at least one opening is transparent.

11. The texture recognition apparatus according to claim 10, wherein a material of the first touch electrode and a material of the second touch electrode are transparent conductive materials; or
the first touch electrode and the second touch electrode respectively comprise a plurality of metal wire portions and at least one transparent wire portion, the at least one transparent wire portion electrically connects two adjacent metal wire portions of the plurality of metal wire portions, and an orthographic projection of the at least one transparent wire portion on the base substrate at least partially overlaps with an orthographic projection of the at least one opening on the base substrate.

12. The texture recognition apparatus according to claim 4, wherein the display panel further comprises a pixel definition layer for defining the plurality of sub-pixels, and the pixel definition layer is configured to filter light with a wavelength greater than 600 nm.

13. The texture recognition apparatus according to claim 1, wherein an overall planar pattern of the middle light shielding pattern is rectangular, and the planar pattern of the middle light shielding pattern is same as a planar shape of the first image sensor.

14. The texture recognition apparatus according to claim 13, wherein the middle light shielding pattern comprises a plurality of shielding units,
each of the plurality of shielding units is square, a sub-opening is between two adjacent shielding units, and the first opening comprises the sub-opening.

15. The texture recognition apparatus according to claim 14, wherein the first image sensor comprises a plurality of sensing regions that are in a one-to-one correspondence with the plurality of shielding units,
for one shielding unit and one sensing region that are in correspondence with each other, an orthographic projection of the one shielding unit on a base substrate at least partially overlaps with an orthographic projection of the one sensing region on the base substrate.

16. The texture recognition apparatus according to claim 13, the half width of the middle light shielding pattern is in a range of 6 µm-18 µm.

* * * * *